US012559676B2

(12) United States Patent
Kossoy et al.

(10) Patent No.: US 12,559,676 B2
(45) Date of Patent: Feb. 24, 2026

(54) COMPOSITION INCLUDING AT LEAST ONE LIGHT-EMITTING MOIETY

(71) Applicant: SAMSUNG ELECTRONICS CO., LTD., Suwon-si (KR)

(72) Inventors: Elizaveta Kossoy, Jerusalem (IL); Hiromoto Sato, Tokyo (JP); Tadashi Kishimoto, Tokyo (JP); Tomohisa Goto, Tokyo (JP); Teruaki Suzuki, Tokyo (JP)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 18/564,669

(22) PCT Filed: May 31, 2022

(86) PCT No.: PCT/EP2022/064692
§ 371 (c)(1),
(2) Date: Nov. 28, 2023

(87) PCT Pub. No.: WO2022/253799
PCT Pub. Date: Dec. 8, 2022

(65) Prior Publication Data

US 2024/0376375 A1 Nov. 14, 2024

(30) Foreign Application Priority Data

Jun. 1, 2021 (EP) .................................... 21177021

(51) Int. Cl.
*C09K 11/06* (2006.01)
*C09D 11/037* (2014.01)
(Continued)

(52) U.S. Cl.
CPC ............ *C09K 11/06* (2013.01); *C09D 11/037* (2013.01); *C09D 11/101* (2013.01);
(Continued)

(58) Field of Classification Search
CPC ....................... C09K 11/06; C09K 2211/1025; G02B 5/223; G02F 1/133514
See application file for complete search history.

(56) References Cited

U.S. PATENT DOCUMENTS

2017/0174921 A1* 6/2017 He ......................... C09D 11/50
2017/0176854 A1 6/2017 Park et al.
(Continued)

FOREIGN PATENT DOCUMENTS

KR 20170035688 A * 3/2017 ............. C09K 11/02
WO 2016/134820 A1 9/2016
(Continued)

OTHER PUBLICATIONS

International Search Report and Written Opinion received for PCT Patent Application No. PCT/EP2022/064692, mailed on Sep. 5, 2022, 11 pages.
(Continued)

*Primary Examiner* — Bijan Ahvazi
(74) *Attorney, Agent, or Firm* — Sughrue Mion, PLLC

(57) ABSTRACT

The present invention relates to a composition comprising at least one light emitting moiety.

17 Claims, 3 Drawing Sheets

(51) Int. Cl.

| | |
|---|---|
| ***C09D 11/101*** | (2014.01) |
| ***C09D 11/107*** | (2014.01) |
| ***C09D 11/322*** | (2014.01) |
| ***C09D 11/50*** | (2014.01) |
| ***C09K 11/02*** | (2006.01) |
| ***G02B 5/22*** | (2006.01) |
| ***G02F 1/1335*** | (2006.01) |
| ***H10K 59/38*** | (2023.01) |
| *B82Y 20/00* | (2011.01) |
| *B82Y 40/00* | (2011.01) |

(52) U.S. Cl.

CPC .......... *C09D 11/107* (2013.01); *C09D 11/322* (2013.01); *C09D 11/50* (2013.01); *C09K 11/025* (2013.01); *G02B 5/223* (2013.01); *G02F 1/133514* (2013.01); *H10K 59/38* (2023.02); *B82Y 20/00* (2013.01); *B82Y 40/00* (2013.01); *C09K 2211/1025* (2013.01)

(56) References Cited

U.S. PATENT DOCUMENTS

| | | | | |
|---|---|---|---|---|
| 2018/0105739 | A1 | 4/2018 | Kim et al. | |
| 2018/0239246 | A1 | 8/2018 | Park et al. | |
| 2021/0098728 | A1 * | 4/2021 | Chung | H10K 50/115 |

FOREIGN PATENT DOCUMENTS

| | | | |
|---|---|---|---|
| WO | 2017/054898 | A1 | 4/2017 |
| WO | 2018/024592 | A1 | 2/2018 |
| WO | 2019/002239 | A1 | 1/2019 |
| WO | 2020/025651 | A1 | 2/2020 |
| WO | 2021/048244 | A1 | 3/2021 |

OTHER PUBLICATIONS

Office Action issued on Sep. 30, 2025 by the China National Intellectual Property Administration in Chinese Patent Application No. 202280039060.7.

* cited by examiner

COMPOSITION INCLUDING AT LEAST ONE LIGHT-EMITTING MOIETY

CROSS-REFERENCE TO RELATED APPLICATIONS

This application is a National stage application (under 35 U.S.C. § 371) of PCT/EP2022/064692, filed May 31, 2022, which claims benefit of European Application No. 21177021.9, filed Jun. 1, 2021, both of which are incorporated herein by reference in their entirety.

FIELD OF THE INVENTION

The present invention relates to a composition, preferably being of a photocurable composition, comprising at least one light emitting moiety; a layer, a color conversion device, an optical device, method for fabricating a composition, method for fabricating a layer a color conversion device and an optical device containing at least one color conversion device.

BACKGROUND ART

WO 2017/054898 A1 describes a composition comprising red emission type nanocrystals, wetting and dispersing agent, propylene glycol monomethyl ether acetate as a solvent, an acryl polymer mixture including an acrylic unit including an acid group and a silane modified acrylic unit.

WO 2019/002239 A1 discloses a composition comprising a semiconducting light emitting nanoparticle, a polymer and a (meth)acrylate such as 1.4. cyclohexanedimethanol-monoacrylate having high viscosity around 90 cp.

PATENT LITERATURE

1. WO 2017/054898 A1
2. WO 2019/002239 A1

SUMMARY OF THE INVENTION

However, the inventors newly have found that there are still one or more of considerable problems for which improvement is desired, as listed below: improved homogeneous dispersion of light emitting moieties in a composition containing a reactive monomer or a monomer mixture of two or more reactive monomers, improved homogeneous dispersion of scattering particles in the composition, preferably improved homogeneous dispersion of both light emitting particles and scattering particles, more preferably improved homogeneous dispersion of light emitting moieties and/or scattering particles without solvent; composition having lower viscosity suitable for inkjet printing, preferably a composition which can keep lower viscosity even if it is mixed with high loading of light emitting moieties and/or scattering particles, even more preferably without solvent; composition having lower vapor pressure for large area uniform printing; a new composition realizing no or reduced residue around ink jet printing nozzle during/after ink jet printing, improved QY and/or EQE of light emitting moieties in the composition, improved QY and/or EQE of light emitting moieties after printing; improved thermal stability; easy printing without clogging at a printing nozzle; easy handling of the composition, improved printing properties; simple fabrication process; improved absorbance of blue light; improved solidity of a layer made from the composition after inkjet printing.

The inventors aimed to solve one or more of the above-mentioned problems.

Then it was found a novel composition, preferably it is being of a photocurable composition, comprising at least;

i) a light emitting moiety having at least one ligand, preferably said light emitting moiety has a plurality of ligands;
ii) at least one reactive monomer or a monomer mixture of two or more reactive monomers; and
iii) a chemical compound, wherein said chemical compound comprises at least one group selected from the group consisting of unsaturated or saturated straight-chain alkyl group having carbon atoms 1 to 80 or unsaturated or saturated branched-chain alkyl group having carbon atoms 3 to 80, unsaturated or saturated straight-chain aryl-alkyl group having carbon atoms 5 to 45, unsaturated or saturated branched-chain aryl-alkyl group having carbon atoms 6 to 45, unsaturated or saturated straight-chain cyclo-alkyl group having carbon atoms 4 to 45; and unsaturated or saturated branched-chain cyclo-alkyl group having carbon atoms 6 to 45, where one or more non-adjacent $CH_2$ groups of the above mentioned groups is replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$;

or at least one group selected from the group consisting of unsaturated or saturated straight-chain alkyl group having carbon atoms 1 to 80 or unsaturated or saturated branched-chain alkyl group having carbon atoms 3 to 80, where one or more non-adjacent $CH_2$ groups is not replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$; unsaturated or saturated straight chain aryl-alkyl group having carbon atoms 4 to 45, unsaturated or saturated branched chain aryl-alkyl group having carbon atoms 6 to 45, unsaturated or saturated straight-chain cyclo-alkyl group having carbon atoms 4 to 45, unsaturated or saturated branched-chain cyclo-alkenyl group having carbon atoms 6 to 45; preferably one or more non-adjacent $CH_2$ groups of said groups is not replaced by oxygen atom, C═O, C═S, C═Se, C═NH, $SiH_2$, SO, $SO_2$, OS, or CONH;

wherein the molecular weight of said chemical compound is 2000 or less, preferably 1000 or less, even more preferably 500 or less and the molecular weight of said chemical compound is 100 or more, preferably 200 or more, even more preferably 300 or more.

In another aspect, the present invention relates to a method for fabricating a composition comprising:

I) identifying the polarity value of a ligand of a light emitting moiety and/or a chemical structure of a ligand of a light emitting moiety;
II) selecting a chemical compound based on the polarity value of the ligand and/or a chemical structure of the light emitting moiety to modify the sum of the polarity value of all the ligand and the polarity value of the chemical compound in the composition;
III) mixing at least the light emitting moiety of step (I) and a reactive monomer or a monomer mixture to obtain the composition;
IV) identifying the polarity value of the reactive monomer where one single reactive monomer is used in said composition or identifying the polarity value of the monomer mixture where the monomer mixture of two or more reactive monomers are used in the composition;

V) optionally, determining the amount of said chemical compound based on the polarity value of the ligand of the light emitting moiety;

wherein said chemical compound is added before step III), in step III) or after step III), preferably in step III) or after step III).

Preferably said ligand is a plurality of ligands attached directly onto the light emitting moiety and said identification in step I) is applied to said plurality of ligands, preferably said chemical compound is a polar ligand selected from the group consisting of unsaturated or saturated straight-chain alkyl group having carbon atoms 1 to 80 or unsaturated or saturated branched-chain alkyl group having carbon atoms 3 to 80, unsaturated or saturated straight-chain aryl-alkyl group having carbon atoms 5 to 45, unsaturated or saturated branched-chain aryl-alkyl group having carbon atoms 6 to 45, unsaturated or saturated straight-chain cyclo-alkyl group having carbon atoms 4 to 45; and unsaturated or saturated branched-chain cyclo-alkyl group having carbon atoms 6 to 45, where one or more non-adjacent $CH_2$ groups of the above mentioned groups is replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$, when said ligand is a non-polar ligand selected from the group consisting of unsaturated or saturated straight-chain alkyl group having carbon atoms 1 to 80 or unsaturated or saturated branched-chain alkyl group having carbon atoms 3 to 80, unsaturated or saturated straight chain aryl-alkyl group having carbon atoms 4 to 45, unsaturated or saturated branched chain aryl-alkyl group having carbon atoms 6 to 45, unsaturated or saturated straight-chain cyclo-alkyl group having carbon atoms 4 to 45, unsaturated or saturated branched-chain cyclo-alkenyl group having carbon atoms 6 to 45, where one or more non-adjacent $CH_2$ groups of said groups of the non-polar ligand is not replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$; said chemical compound is a non-polar ligand selected from the group consisting of unsaturated or saturated straight-chain alkyl group having carbon atoms 1 to 80 or unsaturated or saturated branched-chain alkyl group having carbon atoms 3 to 80, unsaturated or saturated straight chain aryl-alkyl group having carbon atoms 4 to 45, unsaturated or saturated branched chain aryl-alkyl group having carbon atoms 6 to 45, unsaturated or saturated straight-chain cyclo-alkyl group having carbon atoms 4 to 45, unsaturated or saturated branched-chain cyclo-alkenyl group having carbon atoms 6 to 45, where one or more non-adjacent $CH_2$ groups of said groups of the non-polar ligand is not replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$ when said ligand is a polar ligand selected from the group consisting of unsaturated or saturated straight-chain alkyl group having carbon atoms 1 to 80 or unsaturated or saturated branched-chain alkyl group having carbon atoms 3 to 80, unsaturated or saturated straight-chain aryl-alkyl group having carbon atoms 5 to 45, unsaturated or saturated branched-chain aryl-alkyl group having carbon atoms 6 to 45, unsaturated or saturated straight-chain cyclo-alkyl group having carbon atoms 4 to 45; and unsaturated or saturated branched-chain cyclo-alkyl group having carbon atoms 6 to 45, where one or more non-adjacent $CH_2$ groups of the above mentioned groups is replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$.

In another aspect, the present invention relates to composition obtained or obtainable by the method of the present invention.

In another aspect, the present invention relates to a method for forming a layer comprising:

S1) providing the composition of the present invention onto a substrate, preferably by ink-jetting;

S2) curing the composition, preferably said curing is a photo curing performed by photo irradiation, thermal curing or a combination of a photo curing and a thermal curing.

In another aspect, the invention relates to a layer obtained or obtainable by curing the composition of the present invention or a layer obtained or obtainable by the method of the present invention.

In another aspect, the present invention relates to a layer containing at least;

X) a light emitting moiety having at least one ligand, preferably said light emitting moiety has a plurality of ligands;

XI) a (meth)acrylate polymer; and

XII) a chemical compound, wherein said chemical compound comprises at least one group selected from the group consisting of unsaturated or saturated straight-chain alkyl group having carbon atoms 1 to 80 or unsaturated or saturated branched-chain alkyl group having carbon atoms 3 to 80, where one or more non-adjacent $CH_2$ groups is replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$; unsaturated or saturated straight-chain alkoxyl group having carbon atoms 1 to 45 or unsaturated or saturated branched chain alkoxyl group having carbon atoms 3 to 45; unsaturated or saturated straight-chain aryl-alkoxyl group having carbon atoms 5 to 45, unsaturated or saturated branched-chain aryl-alkoxyl group having carbon atoms 6 to 45; and unsaturated or saturated cyclo-alkoxyl group having carbon atoms 4 to 45;

or at least one group selected from the group consisting of unsaturated or saturated straight-chain alkyl group having carbon atoms 1 to 80 or unsaturated or saturated branched-chain alkyl group having carbon atoms 3 to 80, where one or more non-adjacent $CH_2$ groups is not replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$; straight-chain alkenyl group having carbon atoms 2 to 45; branched chain alkenyl group having carbon atoms 3 to 45; unsaturated or saturated straight chain aryl-alkyl group having carbon atoms 4 to 45; unsaturated or saturated branched chain aryl-alkyl group having carbon atoms 6 to 45, straight-chain aryl-alkenyl group having carbon atoms 5 to 45, branched chain aryl-alkenyl group having carbon atoms 6 to 45, unsaturated or saturated cyclo-alkyl group having carbon atoms 4 to 45, cyclo-alkenyl group having carbon atoms 4 to 45; preferably one or more non-adjacent $CH_2$ groups of said groups is not replaced by oxygen atom, C═O, C═S, C═Se, C═NH, $SiH_2$, SO, $SO_2$, OS, or CONH;

wherein the molecular weight of said chemical compound is 2000 or less, preferably 1000 or less, even more preferably 500 or less and the molecular weight of said chemical compound is 100 or more, preferably 200 or more, even more preferably 300 or more.

In another aspect, the present invention further relates to a color conversion device (100) comprising at least, essentially consisting of or consisting of, a $1^{st}$ pixel (161) partly or fully filled with the layer of the present invention, comprising at least a matrix material (120) containing a light emitting moiety (110), and a bank (150) comprising at least a polymer material, preferably the color conversion device (100) further contains a supporting medium (170).

In another aspect, the present invention further relates to use of the composition of the present invention for fabricating the layer of the present invention or the device (100) of the present invention.

In another aspect, the present invention relates to a method for fabricating a color conversion device (100) of the present invention containing at least, essentially consisting of or consisting of, the following steps, preferably in this sequence;

Xi) Providing a bank composition onto a surface of a supporting medium

Xii) Curing the bank composition,

Xiii) Applying photo-patterning to the cured said composition to fabricate bank and a patterned pixel region, Xiv) Providing the composition of the present invention to at least one pixel region, preferably by ink-jetting, Xv) Curing the composition, preferably said color conversion device (100) further contains a supporting medium (170).

In another aspect, the present invention further relates to a color conversion device (100) obtainable or obtained from the method of the present invention.

In another aspect, the present invention also relates to use of the color conversion device (100) of the present invention in an optical device (300) containing at least one functional medium (320, 420, 520) configured to modulate a light or configured to emit light.

In another aspect, the present invention furthermore relates to an optical device (300) containing at least one functional medium (320, 420, 520) configured to modulate a light or configured to emit light, and the color conversion device (100) of the present invention.

Further advantages of the present invention will become evident from the following detailed description.

LIST OF REFERENCE SIGNS IN FIG. 1

Figure 1:
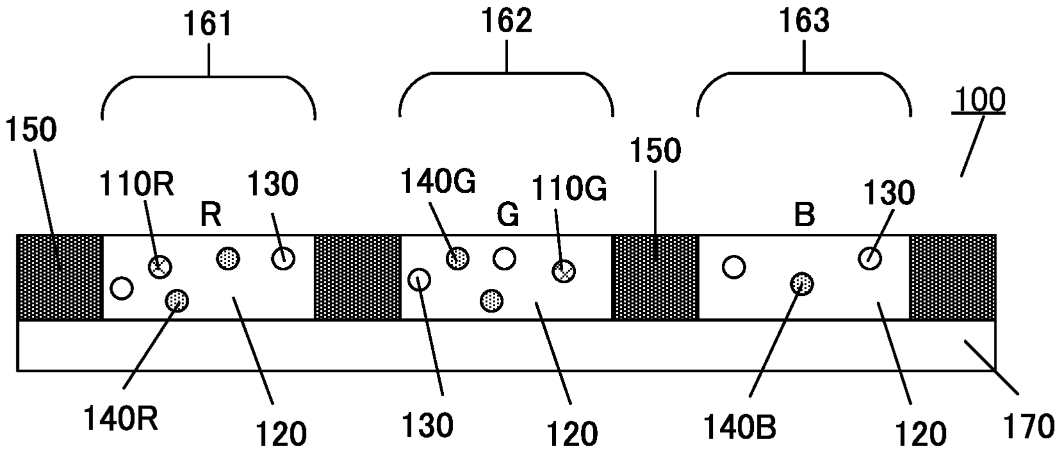
FIG. 1: shows a cross sectional view of a schematic of one embodiment of a color conversion film (100).
Figure 2:
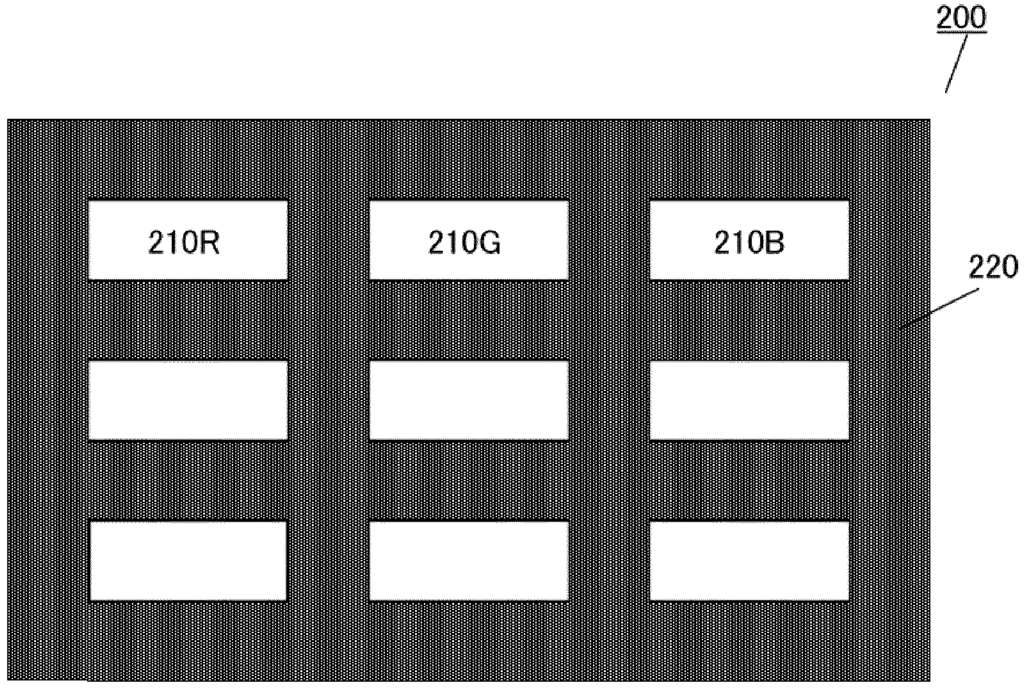
FIG. 2: shows a top view of a schematic of another embodiment of a color conversion film (100) of the invention.
Figure 3:
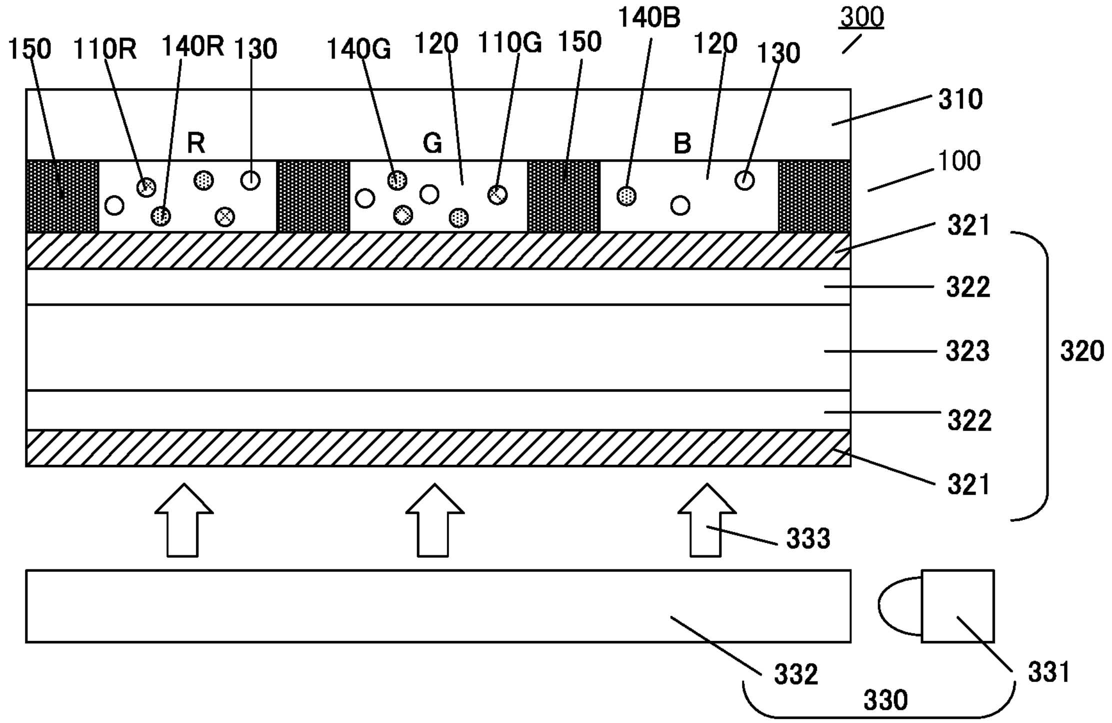
FIG. 3: shows a cross sectional view of a schematic of one embodiment of an optical device (300) of the invention.
Figure 4:
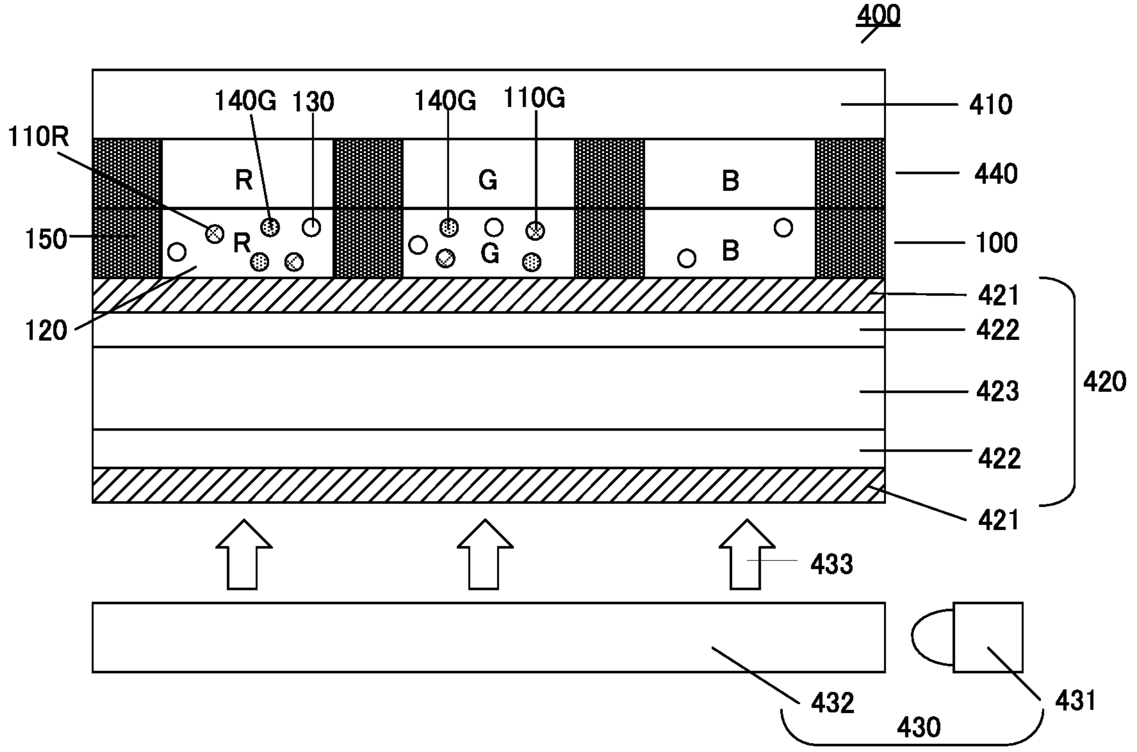
FIG. 4: shows a cross sectional view of a schematic of another embodiment of an optical device (300) of the invention.
Figure 5:
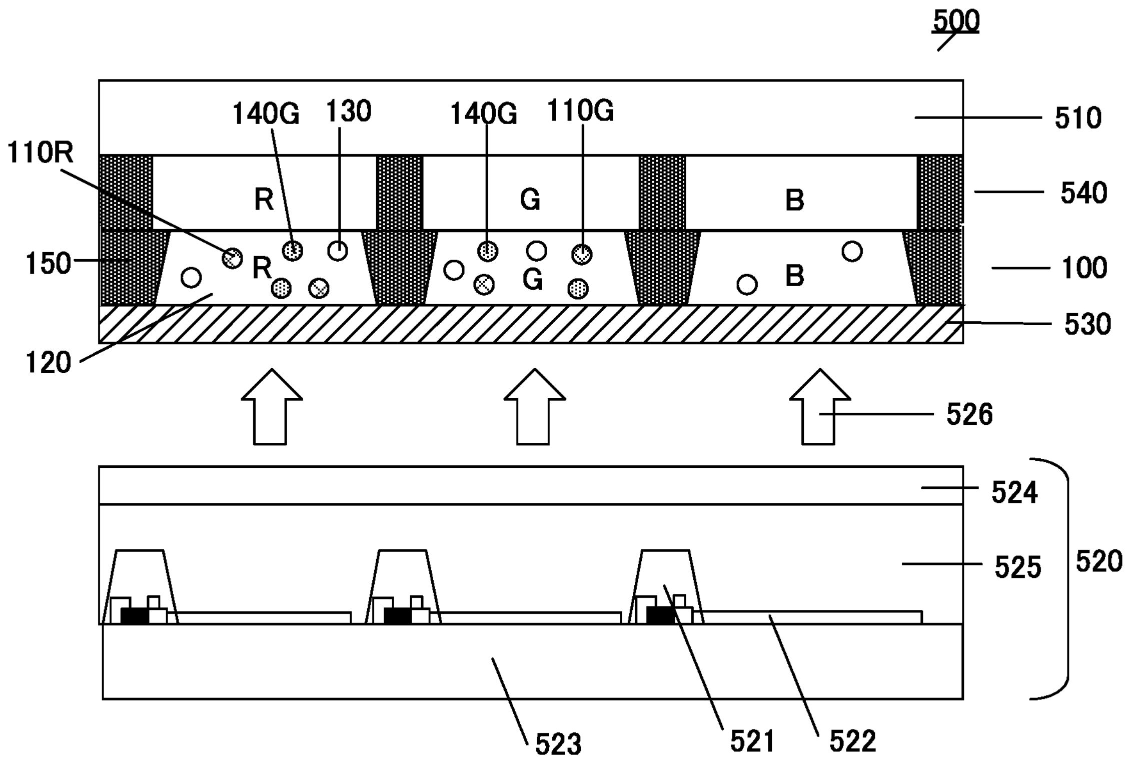
FIG. 5: shows a cross sectional view of a schematic of another embodiment of an optical device (300) of the invention.

100. a color conversion device
110. a light emitting moiety
110R. a light emitting moiety (red)
110G. a light emitting moiety (green)
120. a matrix material
130. a light scattering particle (optional)
140. a coloring agent (optional)
140R. a coloring agent (red) (optional)
140G. a coloring agent (green) (optional)
140B. a coloring agent (blue) (optional)
150. a bank
161. a $1^{st}$ pixel
162. a $2^{nd}$ pixel
163. a $3^{rd}$ pixel
170. a supporting medium (a substrate) (optional)

LIST OF REFERENCE SIGNS IN FIG. 2

200. a color conversion film
210R. a pixel (red)
210G. a pixel (green)
210B. a pixel (blue)
220. a bank

LIST OF REFERENCE SIGNS IN FIG. 3

300. an optical device
100. a color conversion device
110. a light emitting moiety
110R. a light emitting moiety (red)
110G. a light emitting moiety (green)
120. a matrix material
130. a light scattering particle (optional)
140. a coloring agent (optional)
140R. a coloring agent (red) (optional)
140G. a coloring agent (green) (optional)
140B. a coloring agent (blue) (optional)
150. a bank
320. a light modulator
321. a polarizer
322. an electrode
323. a liquid crystal layer
330. a light source
331. a LED light source
332. a light guiding plate (optional)
333. light emission from the light source (330)

LIST OF REFERENCE SIGNS IN FIG. 4

400. an optical device
100. a color conversion device
110. a light emitting moiety
110R. a light emitting moiety (red)
110G. a light emitting moiety (green)
120. a matrix material
130. a light scattering particle (optional)
140. a coloring agent (optional)
140R. a coloring agent (red) (optional)
140G. a coloring agent (green) (optional)
140B. a coloring agent (blue) (optional)
150. a bank
420. a light modulator
421. a polarizer
422. an electrode
423. a liquid crystal layer
430. a light source
431. a LED light source
432. a light guiding plate (optional)
440. a color filter
433. light emission from the light source (330)

LIST OF REFERENCE SIGNS IN FIG. 5

500. an optical device
100. a color conversion device
110. a light emitting moiety
110R. a light emitting moiety (red)
110G. a light emitting moiety (green)
120. a matrix material
130. a light scattering particle (optional)
140. a coloring agent (optional)
140R. a coloring agent (red) (optional)
140G. a coloring agent (green) (optional)
140B. a coloring agent (blue) (optional)
150. a bank
520. a light emitting device (e.g., OLED)
521. a TFT
522. an electrode (anode)
523. a substrate
524. an electrode (cathode)
525. light emitting layer (e.g., OLED layer(s))
526. light emission from a light emitting device (520)
530. an optical layer (e.g., polarizer) (optional)
540. a color filter Definition of the Terms In the present specification, symbols, units, abbreviations, and terms have the following meanings unless otherwise specified.

In the present specification, unless otherwise specifically mentioned, the singular form includes the plural form and "one" or "that" means "at least one". In the present specification, unless otherwise specifically mentioned, an element of a concept can be expressed by a plurality of species, and when the amount (for example, mass % or mol %) is described, it means sum of the plurality of species. "and/or" includes a combination of all elements and also includes single use of the element.

In the present specification, when a numerical range is indicated using "to" or "-", it includes both endpoints and units thereof are common. For example, 5 to 25 mol % means 5 mol % or more and 25 mol % or less.

In the present specification, the hydrocarbon means one including carbon and hydrogen, and optionally including oxygen or nitrogen. The hydrocarbyl group means a monovalent or divalent or higher valent hydrocarbon. In the present specification, the aliphatic hydrocarbon means a linear, branched or cyclic aliphatic hydrocarbon, and the aliphatic hydrocarbon group means a monovalent or divalent or higher valent aliphatic hydrocarbon. The aromatic hydrocarbon means a hydrocarbon comprising an aromatic ring which may optionally not only comprise an aliphatic hydrocarbon group as a substituent but also be condensed with an alicycle. The aromatic hydrocarbon group means a monovalent or divalent or higher valent aromatic hydrocarbon. Further, the aromatic ring means a hydrocarbon comprising a conjugated unsaturated ring structure, and the alicycle means a hydrocarbon having a ring structure but comprising no conjugated unsaturated ring structure.

In the present specification, the alkyl means a group obtained by removing any one hydrogen from a linear or branched, saturated hydrocarbon and includes a linear alkyl and branched alkyl, and the cycloalkyl means a group obtained by removing one hydrogen from a saturated hydrocarbon comprising a cyclic structure and optionally includes a linear or branched alkyl in the cyclic structure as a side chain.

In the present specification, the aryl means a group obtained by removing any one hydrogen from an aromatic hydrocarbon. The alkylene means a group obtained by removing any two hydrogens from a linear or branched, saturated hydrocarbon. The arylene means a hydrocarbon group obtained by removing any two hydrogens from an aromatic hydrocarbon.

In the present specification, when polymer has a plural type of repeating units, these repeating units copolymerize. These copolymerization are any of alternating copolymerization, random copolymerization, block copolymerization, graft copolymerization, or a mixture of any of these.

According to the present invention, the term "(meth) acrylate polymer" means a methacrylate polymer, an acrylate polymer or a combination of methacrylate polymer and an acrylate polymer.

The term "emission" means the emission of electromagnetic waves by electron transitions in atoms and molecules.

In the present specification, Celsius is used as the temperature unit. For example, 20 degrees means 20 degrees Celsius.

DETAILED DESCRIPTION OF THE INVENTION

According to the present invention, in one aspect, the composition comprises at least, essentially consisting of or consisting of;

i) a light emitting moiety having at least one ligand, preferably said light emitting moiety has a plurality of ligands;
ii) at least one reactive monomer or a monomer mixture of two or more reactive monomers; and
iii) a chemical compound, wherein said chemical compound comprises at least one group selected from the group consisting of unsaturated or saturated straight-chain alkyl group having carbon atoms 1 to 80 or unsaturated or saturated branched-chain alkyl group having carbon atoms 3 to 80, unsaturated or saturated straight-chain aryl-alkyl group having carbon atoms 5 to 45, unsaturated or saturated branched-chain aryl-alkyl group having carbon atoms 6 to 45, unsaturated or saturated straight-chain cyclo-alkyl group having carbon atoms 4 to 45; and unsaturated or saturated branched-chain cyclo-alkyl group having carbon atoms 6 to 45, where one or more non-adjacent $CH_2$ groups of the above mentioned groups is replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$;

or at least one group selected from the group consisting of unsaturated or saturated straight-chain alkyl group having carbon atoms 1 to 80 or unsaturated or saturated branched-chain alkyl group having carbon atoms 3 to 80, where one or more non-adjacent $CH_2$ groups is not replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$; unsaturated or saturated straight chain aryl-alkyl group having carbon atoms 4 to 45, unsaturated or saturated branched chain aryl-alkyl group having carbon atoms 6 to 45, unsaturated or saturated straight-chain cyclo-alkyl group having carbon atoms 4 to 45, unsaturated or saturated branched-chain cyclo-alkenyl group having carbon atoms 6 to 45; preferably one or more non-adjacent $CH_2$ groups of said groups is not replaced by oxygen atom, C═O, C═S, C═Se, C═NH, $SiH_2$, SO, $SO_2$, OS, or CONH;

wherein the molecular weight of said chemical compound is 2000 or less, preferably 1000 or less, even more preferably 500 or less and the molecular weight of said chemical compound is 100 or more, preferably 200 or more, even more preferably 300 or more. It means, the chemical compound of the present invention is not a polymer. It is a monomer or oligomer.

—Chemical Compound

It is believed that the chemical compound of the present invention is preferable to control polarity value of the composition, namely, to adjust polarity value of the light emitting moiety (e.g., QDs) to the polarity value of the mixture of reactive monomers by placing it in the composition. Then it can realize the well dispersed light emitting moieties in the composition. More preferably it can prevent increasement of viscosity of the composition and/or keeping a good disperse of the light luminescent moieties in the composition in a long term storage. Preferable placement of the chemical compound is addition of it into the composition to avoid QY drop of the light emitting moiety.

In a preferred embodiment of the present invention, said chemical compound further comprises at least one group selected from one or more of members of the group consisting of phosphine group, phosphine oxide group, phosphate group, phosphonate group, thiol group, tertiary amine, carboxyl group, hetero cyclic group, silane group, sulfonic acid, hydroxyl group, phosphonic acid, preferably said group is a phosphate group, a phosphonate group, thiol group, a carboxyl group or a combination of any of these, more preferably it is a thiol group.

It is believed that a phosphonate group, thiol group, a carboxyl group or a combination of any of these are more preferable since it has better attaching ability to the outer most surface of the inorganic part of the light emitting moiety (such as the surface of the inorganic part of quantum materials).

It is also believed that above mentioned groups are preferable to increase dispersibility of the light emitting moiety (e.g., quantum dots) in a composition.

In a preferred embodiment of the present invention, said chemical compound is a polar ligand selected from one or more members of the group consisting of unsaturated or saturated straight-chain alkyl group having carbon atoms 1 to 80 or unsaturated or saturated branched-chain alkyl group having carbon atoms 3 to 80, unsaturated or saturated straight-chain aryl-alkyl group having carbon atoms 5 to 45, unsaturated or saturated branched-chain aryl-alkyl group having carbon atoms 6 to 45, unsaturated or saturated straight-chain cyclo-alkyl group having carbon atoms 4 to 45; and unsaturated or saturated branched-chain cyclo-alkyl group having carbon atoms 6 to 45, where one or more non-adjacent $CH_2$ groups of the above mentioned groups is replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$; and said ligand is a non-polar ligand selected from the group consisting of unsaturated or saturated straight-chain alkyl group having carbon atoms 1 to 80 or unsaturated or saturated branched-chain alkyl group having carbon atoms 3 to 80, unsaturated or saturated straight chain aryl-alkyl group having carbon atoms 4 to 45, unsaturated or saturated branched chain aryl-alkyl group having carbon atoms 6 to 45, unsaturated or saturated straight-chain cyclo-alkyl group having carbon atoms 4 to 45, unsaturated or saturated branched-chain cyclo-alkenyl group having carbon atoms 6 to 45, where one or more non-adjacent $CH_2$ groups of said groups of the non-polar ligand is not replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$; or said chemical compound is a non-polar ligand selected from one or more members of the group selected from ligand selected from the group consisting of unsaturated or saturated straight-chain alkyl group having carbon atoms 1 to 80 or unsaturated or saturated branched-chain alkyl group having carbon atoms 3 to 80, unsaturated or saturated straight chain aryl-alkyl group having carbon atoms 4 to 45, unsaturated or saturated branched chain aryl-alkyl group having carbon atoms 6 to 45, unsaturated or saturated straight-chain cyclo-alkyl group having carbon atoms 4 to 45, unsaturated or saturated branched-chain cyclo-alkenyl group having carbon atoms 6 to 45, where one or more non-adjacent $CH_2$ groups of said groups of the non-polar ligand is not replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$; and said ligand is a polar ligand selected from the group consisting of unsaturated or saturated straight-chain alkyl group having carbon atoms 1 to 80 or unsaturated or saturated branched-chain alkyl group having carbon atoms 3 to 80, unsaturated or saturated straight-chain aryl-alkyl group having carbon atoms 5 to 45, unsaturated or saturated branched-chain aryl-alkyl group having carbon atoms 6 to 45, unsaturated or saturated straight-chain cyclo-alkyl group having carbon atoms 4 to 45; and unsaturated or saturated branched-chain cyclo-alkyl group having carbon atoms 6 to 45, where one or more non-adjacent $CH_2$ groups of the above mentioned groups is replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$.

It is believed that selecting polar ligand as the chemical compound when ligands attached directly onto a light emitting moiety is a non-polar ligand, and selecting non-polar ligand as the chemical compound when ligands of the light emitting moiety is a polar type ligand, reduces a polarity difference between light emitting moiety and a reactive monoer/monomer mixture of two or more reactive monomers of the composition, resulting in good dispersibility of the light emitting moiety, improved External Quantum Efficiency (EQE) value of the composition and a layer obtained from the composition and/or improved ink jetting properties.

According to the present invention, publicly known/available chemical compounds within the scope of above definition of polar ligands, non-polar ligands can be used.

According to the present invention, preferably, the total amount of said chemical compound (T) added in the composition is determined based on the following formula ($I^a$) and ($II^a$).

$$Tch=(Pl-Pm)*Al/(Pm-P) \quad (I^a)$$

Pl: polarity value of the ligand of the light emitting moiety

Pm: the polarity value of the monomer mixture where the monomer mixture of two or more reactive monomers are used in the composition Al: total amount of the ligand P: polarity value of the chemical compound Tch: predetermined total amount of the chemical compound $$T=Tch*Z \quad (II^a)$$

$0.5 \leq Z \leq 1.5$, preferably $0.7 \leq Z \leq 1.3$, more preferably $0.8 \leq Z \leq 1.2$;

T: Total amount of the chemical compound

By using this determination, the technical effects of the present invention, especially good dispersibility of the light emitting moiety, improved External Quantum Efficiency (EQE) value of the composition and a layer obtained from the composition and/or improved ink jetting properties, can be optimized/improved furthermore.

More preferably, as the polar ligand, the chemical compound is represented by following chemical formula ($X^A$).

$$Z^A(-X^A)u-Y^A \quad (X^A)$$

wherein $Z^A$ is a group selected from one or more members of the group consisting of phosphine group, phosphine oxide group, phosphate group, phosphonate group, thiol group, tertiary amine, carboxyl group, hetero cyclic group, silane group, sulfonic acid, hydroxyl group, phosphonic acid, preferably said group is a phosphonate group, thiol group, a carboxyl group or a combination of any of these, more preferably it is a thiol group, more preferably it is —SH;

$X^A$ is a single bond, an unsaturated or saturated straight-chain alkyl group having carbon atoms 1 to 5, or an unsaturated or saturated branched-chain alkyl group having carbon atoms 3 to 5, where one or more non-adjacent $CH_2$ groups is replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$, an unsaturated or saturated straight-chain alkoxy group having carbon atoms 1 to 5, where (—X)u is not a poly alkoxylene group;

u is 0 or 1, preferably u is 0;

$Y^A$ is an unsaturated or saturated straight-chain alkyl group having carbon atoms 1 to 80, or unsaturated or saturated branched-chain alkyl group having carbon atoms 3 to 80, preferably it is 8 to 70, more preferably 12 to 60, where one or more non-adjacent $CH_2$ groups is replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$, preferably one or more non-adjacent $CH_2$ groups is replaced by oxygen atom, further more preferably Y is represented by the following formula, $$*—[CH(R^{A1})—CH(R^{A2})Q]_x-R^{A3},$$

wherein $R^{A1}$ is H or an alkyl group having carbon atoms 1 to 5, preferably said alkyl group is an methyl group; $R^{A2}$ is H or an alkyl group having carbon atoms 1 to 5, preferably said alkyl group is an methyl group, Q is an oxygen atom, nitrogen atom or sulfur atom, preferably Q is an oxygen atom; $R^{A3}$ is H or a methyl group, x is an integer, preferably x is in the range from 1 to 300, more preferably from 2 to 200, even more preferably from 4 to 100, where "*" represents the connecting point to symbol $X^A$ of the formula when u is 1 and "*" represents the connecting point to symbol $Z^A$ of the formula when u is 0;

or $$*—[(CHR^{A1})_n-Q)]_x-R^{A3}$$

wherein n is 2 or 3, Q is an oxygen atom, nitrogen atom or sulfur atom, preferably Q is an oxygen atom, $R^1$ is H or a methyl group, $R^3$ is H or a methyl group, n is 1 to 5, preferably 1 to 3, more preferably n is 2, x is an integer, preferably x is in the range from 1 to 300, more preferably from 2 to 200, even more preferably from 4 to 100, where "*" represents the connecting point to symbol $X^A$ of the formula when u is 1 and "*" represents the connecting point to symbol $Z^A$ of the formula when u is 0.

It is believed that said weight ratio of the chemical compound is very preferable to control viscosity/solubility of the composition accordingly. And it is very preferable to prevent increasement of viscosity of the composition and/or keeping a good solubility of the light luminescent moieties in a long term storage in the composition.

As the polar type chemical compound, mercapto propionic acid, mercaptoundecanoicacid, erucic acid, octadecanethiol, Polyethylenimine (PEI), monofunctional PEG thiol (mPEG-thiol), thiolated materials as described in U.S. Pat. No. 1,102,651B2 represented by chemical formula (I) or chemical formula (II) of U.S. Pat. No. 1,102,651B2 such as a carboxylic acid polyethylene oxide/propylene oxide (M1000-SH: example 1) and derivatives can be used as the polar type chemical compound.

As the non-polar type chemical compound, Trioctylphosphine oxide (TOPO), Trioctylphosphine (TOP), Tributylphosphine (TBP); Dodecylphosphonic acid (DDPA), Tridecylphosphonic acid (TDPA), Octadecylphosphonic acid (ODPA), and Hexylphosphonic acid (HPA); Oleylamine, Dedecyl amine (DDA), Tetradecyl amine (TDA), Hexadecyl amine (HDA), and Octadecyl amine (ODA), Oleylamine (OLA), 1-Octadecene (ODE), dodecane thiol (DDT), hexadecane thiol and hexane thiol; oleic acid, stearic acid, myristic acid, dodecanoic acid and similar derivatives can be used preferably.

Examples of such chemical compounds have been described in, for example, the laid-open international patent application No. WO 2012/059931A, U.S. Pat. No. 1,102,651 B2.

—Reactive Monomer

It is believed that the lower viscosity is important to make a low viscosity composition suitable for inkjet printing. Therefore, a (meth)acrylate monomer having the viscosity value within the above-mentioned parameter ranges are especially suitable to make a composition for inkjet printing. By using these (meth)acrylate monomer in a composition, when it is mixed with another material such as semiconducting light emitting nanoparticles with high loading, the composition can still keep lower viscosity within the range suitable for inkjet printing.

In a preferred embodiment of the present invention, the boiling point (B.P.) of said reactive monomer is 250° C. or more, preferably it is in the range from 250° C. to 350° C., even more preferably from 280° C. to 350° C., furthermore preferably from 300° C. to 348° C. for large area uniform inkjet printing.

It is believed that said high boiling point is also important to make a composition having a lower vapor pressure preferably less than 0.001 mmHg for large area uniform printing, it is preferable to use a reactive monomer, preferably a (meth)acrylate monomer, more preferably a (meth) acrylate monomer of formula (I), (II) and/or (III) having the viscosity value of 25 cP or less at 25° C. and the boiling point at least 250° C. or more, preferably it is in the range from 250° C. to 350° C., more preferably from 300° C. to 348° C. to make a composition suitable for large area uniform inkjet printing even if it is mixed with high loading of another materials such as high loading of semiconducting light emitting nanoparticles.

Here, the term "(meth)acrylate" is a general term for an acrylate and a methacrylate. Therefore, according to the present invention, the term "(meth)acrylate monomer" means a methacrylate monomer and/or an acrylate monomer.

According to the present invention, said B.P can be estimate by the known method such as like described in Science of Petroleum, Vol. II. p. 1281 (1398).

According to the present invention, any types of publicly available acrylates and/or methacrylates represented by chemical formula (I) or (II) can be used preferably.

Especially for the first aspect, any types of publicly available acrylates and/or methacrylates having the viscosity value of 25 cP or less at 25° C. represented by chemical formula (I), (II) and/or (III) can be used.

Thus, according to the present invention, the reactive monomer of the composition is preferably a (meth)acrylate monomer selected from a mono-(meth)acrylate monomer, a di-(meth)acrylate monomer and/or a tri-(meth)acrylate monomer.

Preferably said reactive monomers of the monomer mixture is each independently selected from a mono-(meth) acrylate monomer, a di-(meth)acrylate monomer and/or a tri-(meth)acrylate monomer.

Preferably, said di-(meth)acrylate monomer is represented by following chemical formula ($I^b$), said mono-acrylate monomer is represented by following chemical formula ($II^b$) and/or said tri-(meth)acrylate monomer is represented by following chemical formula ($III^b$);

($I^b$)

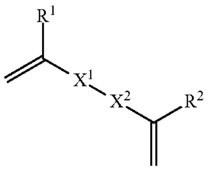

wherein $X^1$ is a non-substituted or substituted alkyl group or aryl group, where one or more non-adjacent $CH_2$ groups of alkyl or aryl group may be replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$; or $X^1$ is an ester group, preferably said alkyl group has carbon atoms 1 to 45, preferably said aryl group has carbon atoms 3 to 45;

$X^2$ is a non-substituted or substituted alkyl group, aryl group, where one or more non-adjacent $CH_2$ groups of alkyl or aryl group may be replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$; or $X^1$ is an ester group, preferably said alkyl group has carbon atoms 1 to 45, preferably said aryl group has carbon atoms 3 to 45;

$R^1$ is a hydrogen atom, halogen atom of Cl, Br, or F, methyl group, alkyl group, aryl group, where one or more non-adjacent $CH_2$ groups of alkyl or aryl group may be replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$; or $X^1$ is an ester group; preferably said ester group is a carboxylic acid group, preferably said alkyl group has carbon atoms 1 to 45, preferably said aryl group has carbon atoms 3 to 45;

$R^2$ is a hydrogen atom, halogen atom of Cl, Br, or F, methyl group, alkyl group, aryl group, where one or more non-adjacent $CH_2$ groups of alkyl or aryl group may be replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$; or $X^1$ is an ester group; preferably said ester group is a carboxylic acid group, preferably said alkyl group has carbon atoms 1 to 45, preferably said aryl group has carbon atoms 3 to 45;

preferably the symbol $X^1$ is

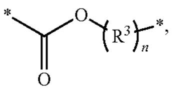

where "*" on the left side of the formula represents the connecting point to the carbon atom of the end group C═$CR^1$ of the formula (I) and "*" on the right side represents the connecting point to symbol $X^2$ of the formula (I);

n is 0 or 1;

preferably the symbol $X^2$ is

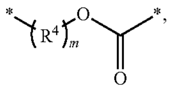

where "*" on the left side of the formula represents the connecting point to symbol X1 of the formula (I) and "*" on the right side represents the connecting point to the end group C═$CR^2$ of the formula (I);

m is 0 or 1;

preferably at least m or n is 1;

$R^3$ is a straight alkylene chain or alkoxylene chain having 1 to 25 carbon atoms, a cycloalkane having 3 to 25 carbon atoms or an aryl group having 3 to 25 carbon atoms, preferably $R^3$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC$═$CR^a$, C═C, $Si(R^a)_2$, $Ge(R^a)_2$, $Sn(R^a)_2$, C═O, C═S, C═Se, C═$NR^a$, P(═O)($R^a$), SO, $SO_2$, $NR^a$, OS, or $CONR^a$ and where one or more H atoms may be replaced by D, F, Cl, Br, I, CN or $NO_2$;

$R^4$ is a straight alkylene chain or alkoxylene chain having 1 to 25 carbon atoms, a cycloalkane having 3 to 25 carbon atoms or an aryl group having 3 to 25 carbon atoms, preferably $R^4$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, C═C, $Si(R^a)_2$, $Ge(R^a)_2$, $Sn(R^a)_2$, C═O, C═S, C═Se, $C{=}NR^a$, $P({=}O)(R^a)$, SO, $SO_2$, $NR^a$, OS, or $CONR^a$ and where one or more H atoms may be replaced by D, F, Cl, Br, I, CN or $NO_2$;

$R^a$ is at each occurrence, identically or differently, H, D or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another;

($II^b$)

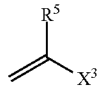

$X^3$ is a non-substituted or substituted alkyl group, aryl group or an alkoxy group;

preferably the symbol $X^3$ is

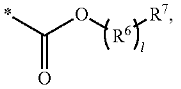

where "*" on the left side of the formula represents the connecting point to the end group $C{=}CR^5$ of the formula (I);

l is 0 or 1;

$R^5$ is a hydrogen atom, halogen atom of Cl, Br, or F, methyl group, alkyl group, aryl group, alkoxy group, ester group, or a carboxylic acid group;

$R^6$ is a straight alkylene chain or alkoxylene chain having 1 to 25 carbon atoms, preferably $R^6$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, C≡C, $Si(R^a)_2$, $Ge(R^a)_2$, $Sn(R^a)_2$, C═O, C═S, C═Se, $C{=}NR^a$, $P({=}O)(R^a)$, SO, $SO_2$, $NR^a$, OS, or $CONR^a$ and where one or more H atoms may be replaced by D, F, Cl, Br, I, CN or $NO_2$;

$R^7$ is a straight alkylene chain or alkoxylene chain having 1 to 25 carbon atoms, preferably $R^7$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, C≡C, $Si(R^a)_2$, $Ge(R^a)_2$, $Sn(R^a)_2$, C═O, C═S, C═Se, $C{=}NR^a$, $P({=}O)(R^a)$, SO, $SO_2$, $NR^a$, OS, or $CONR^a$ and where one or more H atoms may be replaced by D, F, Cl, Br, I, CN or $NO_2$;

$R^a$ is at each occurrence, identically or differently, H, D or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another.

($III^b$)

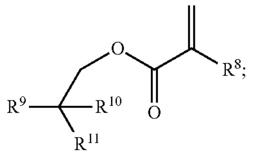

wherein $R^9$ is hydrogen atom, a straight alkyl group having 1 to 25 carbon atoms or a (meth)acryl group represented by chemical formula ($IV^b$)

($IV^b$)

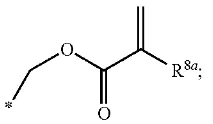

$R^{10}$ is hydrogen atom, a straight alkyl group having 1 to 25 carbon atoms or a (meth)acryl group represented by chemical formula ($V^b$)

($V^b$)

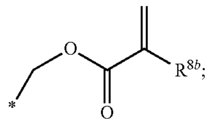

$R^{11}$ is hydrogen atom, a straight alkyl group having 1 to 25 carbon atoms or a (meth)acryl group represented by chemical formula ($VI^b$)

($VI^b$)

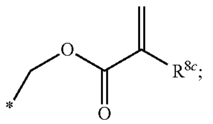

wherein $R^8$, $R^{8a}$, $R^{8b}$ and $R^{8c}$ are, each independently or dependently of each other at each occurrence, H or $CH_3$;

wherein at least one of $R^9$, $R^{10}$ and $R^{11}$ is a (meth)acryl group, preferably two of $R^9$, $R^{10}$ and $R^{11}$ are a (meth) acryl group and other one is a hydrogen atom or a straight alkyl group having 1 to 25 carbon atoms, preferably the electric conductivity (S/cm) of the (meth)acrylate monomer of formula (III) is $1.0*10^{-10}$ or less, preferably it is $5.0*10^{-11}$ or less, more preferably it is in the range from $5.0*10^{-11}$ to $1.0*10^{-15}$, even more preferably it is in the range from $5.0*10^{-12}$ to $1.0*10^{-15}$.

More preferably, said reactive monomer is represented by the chemical formula (II).

In a preferable embodiment, the monomer mixture of the composition comprises a (meth)acrylate monomer of chemical formula (II) and another (meth)acrylate monomer selected from the (meth)acrylate monomer of chemical formula (I) and/or a (meth)acrylate monomer of chemical formula (III).

In a preferred embodiment of the present invention, the (meth)acrylate monomer of chemical formula (II) is in the composition and the mixing ratio of the (meth)acrylate monomer of chemical formula (I) to the (meth)acrylate monomer of chemical formula (II) is in the range from 1:99 to 99:1 (formula (I): formula (II)), preferably from 5:95 to 50:50, more preferably from 10:90 to 40:60, even more preferably it is from 15:85 to 35:65, preferably at least a purified (meth)acrylate monomer represented by chemical formula (I), (II) is used in the composition, more preferably the (meth)acrylate monomer of chemical formula (I) and the (meth)acrylate monomer of chemical formula (II) are both obtained or obtainable by a purification method.

In a preferred embodiment, the boiling point (B.P.) of said (meth)acrylate monomer of chemical formula (I) and/or chemical formula (II) is 250° C. or more, preferably the (meth)acrylate monomers of chemical formula (I) and chemical formula (II) are both 250° C. or more, more preferably it is in the range from 250° C. to 350° C., even more preferably from 280° C. to 350° C., furthermore preferably from 300° C. to 348° C.

In a preferred embodiment of the present invention, the viscosity of the composition is 35 cP or less at room temperature, preferably in the range from 1 to 35 cP, more preferably from 2 to 30 cP, even more preferably from 2 to 25 cP.

According to the present invention, said viscosity can be measured by vibration type viscometer VM-10A (SEKONIC) at room temperature. https://www.sekonic-.co.jplenglish/product/viscometer/vm/vm_series.html —(Meth)Acrylate Monomer Represented by Chemical Formula (I) as a Matrix Material Furthermore preferably, said $R^3$ of formula (I) and $R^4$ of formula (I) are, each independently of each other, selected from the following groups.

$*-(CH_2)_1-*$ $*-(CH_2)_2-*$ $*-(CH_2)_3-*$ $*-(CH_2)_4-*$ $*-(CH_2)_5-*$ $*-(CH_2)_6-*$ $*-(CH_2)_7-*$

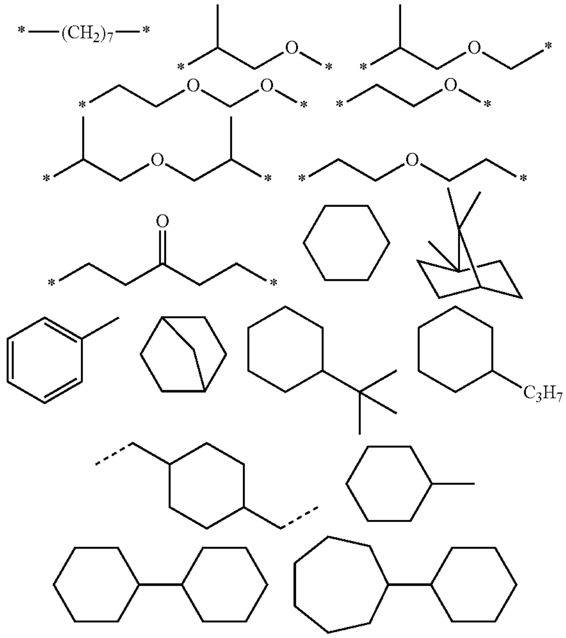

-continued

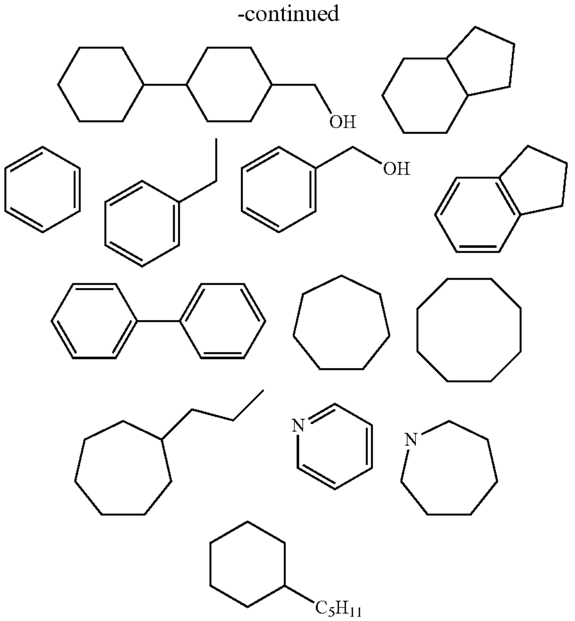

Particularly preferably, said $R^3$ and $R^4$ of formula (I) are, at each occurrence, independently or differently, selected from the following groups.

$*-(CH_2)_1-*$ $*-(CH_2)_2-*$ $*-(CH_2)_3-*$ $*-(CH_2)_4-*$ $*-(CH_2)_5-*$ $*-(CH_2)_6-*$ $*-(CH_2)_7-*$

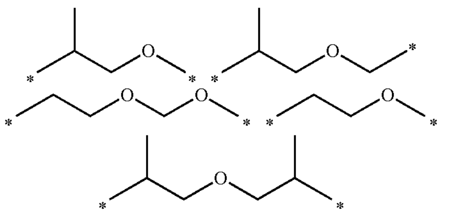

wherein "*" represents the connecting point to oxygen atom of the formula or the connecting point to $X^2$ of the formula in case of $R^3$, and wherein "*" represents the connecting point to oxygen atom of the formula or the connecting point to $X^1$ of the formula in case of $R^4$.

Furthermore preferably, said formula (I) is NDDA (nonanediol diacrylate; BP: 342° C.), HDDMA (hexanediol dimethacrylate; BP: 307), HDDA (hexanediol diacrylate; BP: 295° C.) or DPGDA (BP: 314° C.).

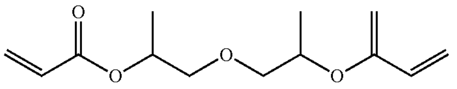

(DPGDA)

—(Meth)Acrylate Monomer Represented by Chemical Formula (II)

It is believed that the (meth)acrylate monomer represented by following chemical formula (II) shows much lower viscosity value than the viscosity of the (meth)acrylate monomer of formula (I). Thus, by using the (meth)acrylate monomer represented by chemical formula (II) in combination of the (meth)acrylate monomer of chemical formula (I), a composition having much lower viscosity desirable for smooth inkjet printing can be realized, preferably without decreasing External Quantum Efficiency (EQE) value.

It is believed that said combination can realize a low viscosity composition comprising high amount of another materials, such as high loading of semiconducting light emitting nanoparticles. Thus, it is especially suitable for an inkjet printing when the composition comprises another material.

In a preferable embodiment of the present invention, the boiling point (B.P.) of said (meth)acrylate monomer of chemical formula (II) is 250° C. or more, preferably the (meth)acrylate monomer of chemical formula (II) is 250° C. or more, more preferably it is in the range from 250° C. to 350° C., even more preferably from 280° C. to 350° C., furthermore preferably from 300° C. to 348° C. for large area uniform inkjet printing.

In a further preferable embodiment of the present invention, the boiling point (B.P.) of said (meth)acrylate monomer of chemical formula (I) and/or the boiling point (B.P.) of said (meth)acrylate monomer of chemical formula (II) is 250° C. or more, preferably the (meth)acrylate monomers of chemical formula (I) and chemical formula (II) are both 250° C. or more, more preferably it is in the range from 250° C. to 350° C., even more preferably from 280° C. to 350° C., further more preferably from 300° C. to 348° C. for large area uniform inkjet printing.

Furthermore preferably, said $R^7$ of formula (II) is, at each occurrence, independently or differently, selected from the following groups, wherein the groups can be substituted with $R^a$, preferably they are unsubstituted by $R^a$.

| | | |
|---|---|---|
| $*-(CH_2)_6-CH_3$ | $*-(CH_2)_7-CH_3$ | $*-(CH_2)_8-CH_3$ |
| $*-(CH_2)_9-CH_3$ | $*-(CH_2)_{10}-CH_3$ | $*-(CH_2)_{11}-CH_3$ |
| $*-(CH_2)_{12}-CH_3$ | $*-(CH_2)_4-OH$ | $*-(CH_2)_2-OH$ |
| $*-(CH_2)_6-OH$ | $*-(CH_2)_3-OH$ | $*-(CH_2)_5-OH$ |

wherein "*" represents the connecting point to $R^6$ of $X^3$ in case I is 1, and it is representing the connecting point to oxygen atom of $X^3$ of the formula (II) in case n is 0.

The furthermore preferably, said formula (II) is Lauryl methacrylate (LM, viscosity 6 cP, BP: 142° C.) or Lauryl acrylate (LA, viscosity: 4.0 cP, BP: 313.2° C.).

It is believed that the higher amount of the (meth)acrylate monomer of chemical formula (II) to the total amount of the (meth)acrylate monomer of chemical formula (I) leads improved EQE of the composition, and the mixing weight ratio of the (meth)acrylate monomer of chemical formula (II) to the total amount of the (meth)acrylate monomer of chemical formula (I) less than 50 wt. % is preferable from the view point of viscosity of the composition, better ink-jetting properties of the composition.

Preferably, (meth)acrylate monomers purified by using silica column are used.

It is believed that an impurity removal from the (meth) acrylate monomers by the silica column purification leads improved QY of the semiconducting light emitting nanoparticle in the composition.

—(Meth)Acrylate Monomer of Chemical Formula (III)

It is believed that the (meth)acrylate monomer of chemical formula (III) is useful to improve its solidity of a later made from the composition after inkjet printing.

According to the present invention, a publicly known a (meth)acrylate monomer represented by following chemical formula (III) can be used to improve solidity of a layer after inkjet printing and cross linking.

Very preferably, Trimethylolpropane Triacrylate (TMPTA) is used as the (meth)acrylate monomer of chemical formula (III).

In a preferable embodiment of the present invention, the amount of the (meth)acrylate monomer of chemical formula (III) based on the total amount of (meth)acrylate monomers in the composition is in the range from 0.001 wt. % to 25 wt. %, more preferably in the range from 0.1 wt. % to 15 wt. %, even more preferably from 1 wt. % to 10 wt. %, furthermore preferably from 3 to 7 wt %.

Preferably, there (meth)acrylate monomers are purified by using silica column, are used.

It is believed that an impurity removal from the (meth) acrylate monomers by the silica column purification leads improved QY of the semiconducting light emitting nanoparticle in the composition.

According to the present invention, preferably the composition is configured to show the EQE value 23% or more, preferably 24% or more and less than 95, preferably less than 50%.

According to the present invention, said EQE is measured by the following EQE measurement process at room temperature which is based on using an integrating sphere, equipped with a 450 nm excitation light source coupled in via an optical fiber, and a spectrometer (Compass X, BWTEK), and which consists of a first measurement using air as the reference to detect the incident photons of the excitation light and a second measurement with the sample or test cell placed in front of the integrating sphere in between the opening of the integrating sphere and the exit of the optical fiber to detect the photons incident from the excitation light source transmitted through the sample and the photos emitted from the sample or test cell, whereas for both cases photons exiting the integrating sphere are counted by the spectrometer and EQE and BL calculation is done with the following equations and the number of photons of the excitation light and emission light is calculated by integration over the following wavelength ranges;

EQE=Photons [Emission light]/Photons [Excitation light measured without sample in place];

*BL*=Photons [Excitation light measured with sample in place]/Photons [Excitation light measured without sample in place];

Emission light if green light emitting moieties are used: 490 nm-600 nm,

Emission light if red light emitting moieties are used: 560 nm-780 nm

Excitation light: 390 nm-490 nm.

According to the present invention, in a preferred embodiment, the viscosity of the composition is 35 cP or less at room temperature, preferably in the range from 1 to 35 cP, more preferably from 2 to 30 cP, even more preferably from 2 to 25 cP.

In a preferred embodiment of the present invention, the composition comprises a solvent 10 wt % or less based on the total amount of the composition, more preferably it is 5 wt % or less, more preferably it is a solvent free composition, preferably the composition does not comprise any one of the following solvent selected from one or more members of the group consisting of ethylene glycol monoalkyl ethers, such as, ethylene glycol monomethyl ether, ethylene glycol monoethyl ether, ethylene glycol monopropyl ether, and ethylene glycol monobutyl ether; diethylene glycol dialkyl ethers, such as, diethylene glycol dimethyl ether, diethylene glycol diethyl ether, diethylene glycol dipropyl ether, and diethylene glycol dibutyl ether; propylene glycol monoalkyl ethers, such as, propylene glycol monomethyl ether(PGME), propylene glycol monoethyl ether, and propylene glycol monopropyl ether; ethylene glycol alkyl ether acetates, such as, methyl cellosolve acetate and ethyl cellosolve acetate; propylene glycol alkyl ether acetates, such as, propylene glycol monomethyl ether acetate (PGMEA), propylene glycol monoethyl ether acetate, and propylene glycol monopropyl ether acetate; ketones, such as, methyl ethyl ketone, acetone, methyl amyl ketone, methyl isobutyl ketone, and cyclohexanone; alcohols, such as, ethanol, propanol, butanol, hexanol, cyclo hexanol, ethylene glycol, triethylene glycol and glycerin; esters, such as, ethyl 3-ethoxypropionate, methyl 3-methoxypropionate and ethyl lactate; and cyclic asters, such as, gamma-butyro-lactone; chlorinated hydrocarbons, such as chloroform, dichloromethane, chlorobenzene, trimethyl benzenes such as 1,3,5-trimethylbenzene, 1,2,4-trimethyl benzene, 1,2,3-trimethyl benzene, docecylbenzene, cyclohexylbenzene, 1,2,3,4-tetramethylbenzene, 1,2,3,5-tetramethylbenzene, 3-isopropylbiphenyl, 3-methylbiphenyl, 4-methylbiphenyl and dichlorobenzene, preferably said solvent is propylene glycol alkyl ether acetates, alkyl acetates, ethylene glycol monoalkyl ethers, propylene glycol, and propylene glycol monoalkyl ethers.

It is believed that the less than 10 wt % of solvent in the composition leads improved ink-jetting and it can avoid $2^{nd}$ or more ink-jetting onto the same pixel after evaporation of the solvent.

According to the present invention, it is desirable not to add any solvent to realize large area inkjet printing with improved uniformity without causing any clogging at a nozzle and/or with good dispersity of semiconducting light emitting nanoparticles and/or with good dispersity of scattering particles.

According to the present invention, preferably the composition further comprises an another material selected from one or more members of the group consisting of;

iii) another light emitting moiety which is different from the light emitting moiety of the present invention, preferably said light emitting moiety comprises a ligand, more preferably said light emitting moiety comprises an alkyl type ligand having carbon atoms 2 to 25;

iv) another (meth)acrylate monomer;

v) scattering particles, and vi) optically transparent polymers, anti-oxidants, radical quenchers, photo initiators and/or surfactants, preferably said another material is a scattering particle.

In some embodiments of the present invention, preferably the composition of the present invention comprises v) scattering particles; and vii) at least one polymer configured so that said polymer enables to the scattering particles to disperse in the composition;

wherein the polymer comprises at least a phosphine group, phosphine oxide group, phosphate group, phosphonate group, thiol group, tertiary amine, carboxyl group, hetero cyclic group, silane group, sulfonic acid, hydroxyl group, phosphonic acid, or a combination of thereof, preferably the polymer comprises a tertiary amine, phosphine oxide group, phosphonic acid, or a phosphate group.

According to the present invention, the polymer configured so that said polymer enables to the scattering particles to disperse in the composition comprises at least a repeating unit A comprising a phosphine group, phosphine oxide group, phosphate group, phosphonate group, thiol group, tertiary amine, carboxyl group, hetero cyclic group, silane group, sulfonic acid, hydroxyl group, phosphonic acid, or a combination of thereof, preferably the repeating unit A comprises a tertiary amine, phosphine oxide group, phosphonic acid, or a phosphate group.

In some embodiments of the present invention, the repeating unit A and the repeating unit B are a constitutional repeating unit.

Even more preferably, the repeating unit A comprises a tertiary amine represented by following chemical formula (VII), $$NR^{12}R^{13}R^{14}— \quad (VII)$$

wherein $R^{12}$ is a hydrogen atom, a straight or a branched alkyl group having 1 to 30 carbon atoms, or an aryl group having 1 to 30 carbon atoms; $R^{13}$ is a hydrogen atom, a straight or a branched alkyl group having 1 to 30 carbon atoms, or an aryl group having 1 to 30 carbon atoms; $R^{12}$ and $R^{13}$ can be same or different of each other; $R^{14}$ is a single bond, a straight or a branched alkylene group having 1 to 30 carbon atoms, alkenylene group having 1 to 30 carbon atoms, (poly) oxaalkylene group having 1 to 30 carbon atoms.

Even more preferably, $R^{12}$ is a straight or a branched alkyl group having 1 to 30 carbon atoms; $R^{13}$ is a straight or a branched alkyl group having 1 to 30 carbon atoms; $R^{12}$ and $R^{13}$ can be same or different of each other.

Furthermore preferably, $R^{12}$ is methyl group, ethyl group, n-propyl group, or n-butyl group; $R^{13}$ is methyl group, ethyl group, n-propyl group, or n-butyl group.

According to the present invention, in a preferred embodiment, the repeating unit A does not contain a salt.

In a preferred embodiment of the present invention, the polymer is a copolymer selected from the group consisting of graft copolymers, block copolymers, alternating copolymers, and random copolymers, preferably said copolymer comprises the repeating unit A, and repeating unit B that does not include any phosphine group, phosphine oxide group, phosphate group, phosphonate group, thiol group, tertiary amine, carboxyl group, hetero cyclic group, silane group, sulfonic acid, hydroxyl group, phosphonic acid, and a combination of thereof, more preferably the copolymer is a block copolymer represented by following chemical formula (VIII) or (IX), $$A_n\text{-}B_m \quad (VIII)$$

$$B_o\text{-}A_n\text{-}B_m \quad (IX)$$

wherein the symbol "A" represents a repeating unit A; the symbol "B" is taken to mean the repeating unit B; the symbols "n", "m", and "o" are at each occurrence, independently or dependently of each other, integers 1 to 100, preferably 5 to 75, more preferably 7 to 50; even more preferably the repeating unit B comprises a polymer chain selected from the group consisting of (poly)ethylene, (poly)phenylene, polydivinylbenzene, (poly)ethers, (poly)esters, (poly)amides, (poly)urethanes, (poly)carbonates, polylactic acids, (poly)vinyl esters, (poly)vinyl ethers, polyvinyl alcohols, polyvinylpyrrolidones, celluloses and derivatives of any of these.

In a preferred embodiment of the present invention, the polymer chain of the repeating unit B is a polyethylene glycol.

More preferably, the repeating unit B comprises a chemical structure represented by following chemical formula (X), Chemical formula (X)

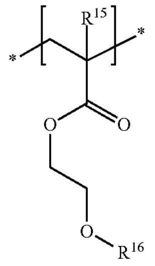

wherein the chemical formula (X), $R^{15}$ is hydrogen atom, or methyl group; $R^{16}$ is alkyl group having 1 to 10 carbon atoms; and n is an integer 1 to 5, "*" represents the connecting point to an another polymer repeating unit or a terminal of the polymer.

Even more preferably, $R^{15}$ can be a hydrogen atom, or methyl group, $R^{16}$ can be an ethyl group, and n is an integer 1 to 5.

In some embodiments of the present invention, the surface of the core, or the outermost surface of one or more shell layers of the semiconducting light emitting nanoparticle can be partly or fully over coated by the polymer. By using ligand exchange method, described in for example, Thomas Nann, Chem. Commun., 2005, 1735-1736, DOI: 10.1039/b-414807j, the polymer can be introduced onto the surface of the core or the outermost surface of the core of the semiconducting light emitting nanoparticle.

According to the present invention, in some embodiments, the content of said polymer is in the range from 1% to 500% by weight, more preferably in the range from 20% to 350% by weight, even more preferably from 50% to 200% by weight with respect to the total weight of the semiconducting light emitting nanoparticle.

In a preferred embodiment of the present invention, the weight average molecular weight (Mw) of the polymer is in the range from 200 g/mol to 30,000 g/mol, preferably from 250 g/mol to 5,000 g/mol, more preferably from 300 g/mol to 2,000 g/mol.

The molecular weight Mw is determined by means of GPC (=gel permeation chromatography) against an internal polystyrene standard.

As the polymer, commercially available wetting and dispersing additives which can be solved in non-polar and/or low polar organic solvent can be used preferably. Such as BYK-111, BYK-LPN6919, BYK-103, BYK-P104, BYK-163 ([trademark], from BYK com.), TERPLUS MD1000 series, such as MD1000, MD1100 ([trademark], from Otsuka Chemical), Poly(ethylene glycol) methyl ether amine (Sigma-Ald 767565 [trademark], from Sigma Aldrich), Polyester bis-MPA dendron, 32 hydroxyl, 1 thiol, (Sigma-Ald 767115 [trademark], from Sigma Aldrich), LIPONOL DA-T/25 (From Lion Specialty Chemicals Co.), Carboxymethyl cellulose (from Polyscience etc.), another wetting and dispersing additives disclosed in for examples, "Marc Thiry et. al., ACSNANO, American Chemical society, Vol. 5, No. 6, pp 4965-4973, 2011", "Kimihiro Susumu, et. al., J. Am. Chem. Soc. 2011, 133, pp 9480-9496".

Thus, in some embodiments of the present invention, the composition comprises at least the (meth)acrylate monomer of chemical formula (I), the (meth)acrylate monomer of chemical formula (II) and the polymer configured so that said polymer enables to the scattering particles to disperse in the composition, wherein the mixing ratio of the (meth) acrylate monomer of chemical formula (I): the (meth)acrylate monomer of chemical formula (II): the polymer is 10:89:1 to 50:40:10, preferably in the range from 15:82:3 to 30:60:10.

In some embodiments of the present invention, the composition comprises at least the (meth)acrylate monomer of chemical formula (III), the (meth)acrylate monomer of chemical formula (II) and the polymer configured so that said polymer enables to the scattering particles to disperse in the composition, wherein the mixing ratio of the (meth) acrylate monomer of chemical formula (III): the (meth) acrylate monomer of chemical formula (II): the polymer is 10:89:1 to 50:40:10, preferably in the range from 15:82:3 to 30:60:10.

In some embodiment of the present invention, a composition comprises, essentially consisting of or consisting of, at least a polymer derived or derivable from the (meth)acrylate monomers of the composition of the present invention.

In a preferred embodiment of the present invention, said polymer is derived or derivable from all the (meth)acrylate monomers in the composition, for example, at least the (meth)acrylate monomer of chemical formula (I) and/or the (meth)acrylate monomer of chemical formula (II).

v) Scattering Particles

According to the present invention, as the scattering particles, publicly known small particles of inorganic oxides such as $SiO_2$, $SnO_2$, CuO, CoO, $Al_2O_3TiO_2$, $Fe_2O_3$, $Y_2O_3$, ZnO, ZnS, MgO; organic particles such as polymerized polystyrene, polymerized PMMA; inorganic hollow oxides such as hollow silica or a combination of any of these; can be used. The amount of the scattering particles is preferably 8 wt % or less based on the total amount of the solid contents of the layer, preferably it is in the range from 4 to 0 wt %, more preferably it is in the range from 1 to 0 wt %, more preferably the layer and/or the composition does not contain any scattering particles.

According to the present invention, as a transparent polymer, a wide variety of publicly known transparent polymers suitable for optical devices, described in for example, WO 2016/134820A can be used preferably.

According to the present invention, the term "transparent" means at least around 60% of incident light transmit at the thickness used in an optical medium and at a wavelength or a range of wavelength used during operation of an optical medium. Preferably, it is over 70%, more preferably, over 75%, the most preferably, it is over 80%.

According to the present invention the term "polymer" means a material having a repeating unit and having the weight average molecular weight (Mw) 1000 g/mol, or more.

The molecular weight Mw is determined by means of GPC (=gel permeation chromatography) against an internal polystyrene standard.

In some embodiments of the present invention, the glass transition temperature (Tg) of the transparent polymer is 70° C. or more and 250° C. or less.

Tg is measured based on changes in the heat capacity observed in Differential scanning colorimetry like described in Rickey J Seyler, Assignment of the Glass Transition, ASTM publication code number (PCN) 04-012490-50.

For example, as the transparent polymer for the transparent matrix material, poly(meth)acrylates, epoxys, polyurethanes, polysiloxanes, can be used preferably.

In a preferred embodiment of the present invention, the weight average molecular weight (Mw) of the polymer as the transparent matrix material is in the range from 1,000 to 300,000 g/mol, more preferably it is from 10,000 to 250,000 g/mol.

According to the present invention, publicly known anti-oxidants, radical quenchers, photo initiators and/or surfactants can be used preferably like described in WO 2016/134820A.

—Light Emitting Moiety (110)

In a preferable embodiment of the present invention, said light emitting moiety (110) is an organic and/or inorganic light emitting material, preferably it is an organic dye, inorganic phosphor and/or a semiconducting light emitting nanoparticle such as a quantum sized material. For the sake of clarity, materials just reflecting an incident light and/or absorbing an incident light and does not emit lights (e.g., pearlescent pigments, color filer dyes,) are not light emitting moiety of the present invention.

In some embodiments of the present invention, the total amount of the light emitting moiety (110) is in the range from 0.1 wt. % to 90 wt. % based on the total amount of the $1^{st}$ pixel (161), preferably from 10 wt. % to 70 wt. %, more preferably from 30 wt. % to 50 wt. %.

—iii) Semiconducting Light Emitting Nanoparticle

According to the present invention, the term "semiconductor" means a material that has electrical conductivity to a degree between that of a conductor (such as copper) and that of an insulator (such as glass) at room temperature. Preferably, a semiconductor is a material whose electrical conductivity increases with the temperature.

The term "nanosized" means the size in between 0.1 nm to 150 nm, more preferably 3 nm to 50 nm.

Thus, according to the present invention, "semiconducting light emitting nanoparticle" is taken to mean that the light emitting material which size is in between 0.1 nm to 150 nm, more preferably 3 nm to 50 nm, having electrical conductivity to a degree between that of a conductor (such as copper) and that of an insulator (such as glass) at room temperature, preferably, a semiconductor is a material whose electrical conductivity increases with the temperature, and the size is in between 0.1 nm and 150 nm, preferably 0.5 nm to 150 nm, more preferably 1 nm to 50 nm.

According to the present invention, the term "size" means the average diameter of circle with an area equal to an average area of dark contrast features in TEM image.

The average diameter of the semiconducting nanosized light emitting particles is calculated based on 100 semiconducting light emitting nanoparticles in a TEM image created by a Tecnai G2 Spirit Twin T-12 Transmission Electron Microscope.

In a preferred embodiment of the present invention, the semiconducting light emitting nanoparticle of the present invention is a quantum sized material (quantum material). More preferably, said quantum sized material is a quantum dot.

According to the present invention, the term "quantum sized" means the size of the semiconducting material itself without ligands or another surface modification, which can show the quantum confinement effect, like described in, for example, ISBN:978-3-662-44822-9.

In a preferred embodiment of the present invention, said core comprises at least one element of the group 13 of the periodic table, and one element of the group 15 of the periodic table, preferably the element of the group 13 is In, and the element of the group 15 is P, more preferably the core material is selected from the group consisting of InP, InPZn, InPZnS, InPZnSe, InPZnSeS, InPZnGa, InPGaS, InPGaSe, InPGaSeS, InPZnGaSeS and InPGa.

According to the present invention, a type of shape of the core of the semiconducting light emitting nanoparticle, and shape of the semiconducting light emitting nanoparticle to be synthesized are not particularly limited.

For examples, spherical shaped, elongated shaped, star shaped, polyhedron shaped, pyramidal shaped, tetrapod shaped, tetrahedron shaped, platelet shaped, cone shaped, and irregular shaped core and—or a semiconducting light emitting nanoparticle can be synthesized.

In some embodiments of the present invention, the average diameter of the core is in the range from 1.5 nm to 3.5 nm.

The average diameter of the core is calculated based on 100 semiconducting light emitting nanoparticles in a TEM image created by a Tecnai G2 Spirit Twin T-12 Transmission Electron Microscope by measuring the longest axis of each single particles.

In some embodiments of the present invention, at least one the shell layer comprises or a consisting of a $1^{st}$ element of group 12 of the periodic table and a $2^{nd}$ element of group 16 of the periodic table, preferably, the $1^{st}$ element is Zn, and the $2^{nd}$ element is S, Se, or Te; preferably a first shell layer covering directly onto said core comprises or a consisting of a $1^{st}$ element of group 12 of the periodic table and a $2^{nd}$ element of group 16 of the periodic table, preferably, the $1^{st}$ element is Zn, and the $2^{nd}$ element is S, Se, or Te, preferably, the shell layer is ZnSe, ZnS, $ZnS_xSe_y$, $ZnSe_yTe_z$ or $ZnS_xTe_z$, wherein $0 \leq x \leq 1$, $0 \leq y \leq 1$, $0 \leq z \leq 1$, and $x+y+z=1$, In some embodiments of the present invention, said shell layer is an alloyed shell layer or a graded shell layer, preferably said graded shell layer is $ZnS_xSe_y$, $ZnSe_yTe_z$, or $ZnS_xTe_z$, more preferably it is $ZnS_xSe_y$.

In some embodiments of the present invention, the semiconducting light emitting nanoparticle further comprises $2^{nd}$ shell layer onto said shell layer, preferably the $2^{nd}$ shell layer comprises or a consisting of a $3^{rd}$ element of group 12 of the periodic table and a $4^{th}$ element of group 16 of the periodic table, more preferably the $3^{rd}$ element is Zn, and the $4^{th}$ element is S, Se, or Te with the proviso that the $4^{th}$ element and the $2^{nd}$ element are not same.

In a preferred embodiment of the present invention, the $2^{nd}$ shell layer is represented by following formula (XI'), $$ZnS_xSe_yTe_z \qquad \text{(XI')}$$

wherein $0 \leq x \leq 1$, $0 \leq y \leq 1$, $0 \leq z \leq 1$, and $x+y+z=1$, preferably, the shell layer is ZnSe, $ZnS_xSe_y$, $ZnSe_yTe_z$, or $ZnS_xTe_z$ with the proviso that the shell layer and the $2^{nd}$ shell layer is not the same.

In some embodiments of the present invention, said $2^{nd}$ shell layer can be an alloyed shell layer.

In some embodiments of the present invention, the semiconducting light emitting nanoparticle can further comprise one or more additional shell layers onto the $2^{nd}$ shell layer as a multishell.

According to the present invention, the term "multishell" stands for the stacked shell layers consisting of three or more shell layers.

For example, quantum sized materials having no shell layers like CdS, CdSe, CdTe, ZnS, ZnSe, ZnSeS, ZnTe, ZnO, GaAs, GaP, GaSb, HgS, HgSe, HgSe, HgTe, InAs, InP, InPZn, InPZnS, InPZnSe, InPZnSeS, InPZnGa, InPGaS, InPGaSe, InPGaSeS, InPZnGaSeS and InPGa, InCdP, InPCdS, InPCdSe, InSb, AlAs, AlP, AlSb, $Cu_2S$, $Cu_2Se$, $CuInS_2$, $CuInSe_2$, $Cu_2(ZnSn)S_4$, $Cu_2(InGa)S_4$; core-shell quantum sized materials such as, CdS, CdSe, CdTe, ZnS, ZnSe, ZnSeS, ZnTe, ZnO, GaAs, GaP, GaSb, HgS, HgSe, HgSe, HgTe, InAs, InP, InPZn, InPZnS, InPZnSe, InPZnSeS, InPZnGa, InPGaS, InPGaSe, InPGaSeS, InPZnGaSeS and InPGa, InCdP, InPCdS, InPCdSe, InSb, AlAs, AlP, AlSb, $Cu_2S$, $Cu_2Se$, $CuInS_2$, $CuInSe_2$, $Cu_2(ZnSn)S_4$, $Cu_2(InGa)S_4$ as a core and ZnSe, ZnS, ZnSeS, ZnSeTe, ZnSTe, core-double shell quantum sized materials such as CdS, CdSe, CdTe, ZnS, ZnSe, ZnSeS, ZnTe, ZnO, GaAs, GaP, GaSb, HgS, HgSe, HgSe, HgTe, InAs, InP, InPZn, InPZnS, InPZnSe, InPZnSeS, InPZnGa, InPGaS, InPGaSe, InPGaSeS, InPZnGaSeS and InPGa, InCdP, InPCdS, InPCdSe, InSb, AlAs, AlP, AlSb, $Cu_2S$, $Cu_2Se$, $CuInS_2$, $CuInSe_2$, $Cu_2(ZnSn)S_4$, $Cu_2(InGa)S_4$ as a core, ZnSe, ZnS, ZnSeS, ZnSeTe, ZnSTe as a first shell, ZnSe, ZnS, ZnSeS, ZnSeTe, ZnSTe as the second shell where the first shell and the second shell are not the same material; can be used preferably.

More preferably, CdSe/CdS, CdSeS/CdZnS, CdSeS/CdS/ZnS, ZnSe/CdS, CdSe/ZnS, InP/ZnS, InP/ZnSe, InP/ZnSe/ZnS, InZnP/ZnS, InZnP/ZnSe, InZnP/ZnSe/ZnS, InGaP/ZnS, InGaP/ZnSe, InGaP/ZnSe/ZnS, InZnPS/ZnS, InZnPS ZnSe, InZnPS/ZnSe/ZnS, ZnSe/CdS, ZnSe/ZnS or combination of any of these, can be used. Furthermore preferably, InP/ZnS, InP/ZnSe, InP/ZnSe/ZnS, InZnP/ZnS, InZnP/ZnSe, InZnP/ZnSe/ZnS, InGaP/ZnS, InGaP/ZnSe, InGaP/ZnSe/ZnS can be used from the viewpoint of less toxicity.

Such semiconducting light emitting nanoparticles are publicly available (for example from Sigma Aldrich) and/or can be synthesized with the method described for example in U.S. Pat. Nos. 7,588,828 B, 8,679,543 B and Chem. Mater. 2015, 27, pp 4893-4898.

In some embodiments of the present invention, the composition comprises two or more semiconducting light emitting nanoparticles.

In some embodiments of the present invention, the composition comprises a plurality of semiconducting light emitting nanoparticles.

In some embodiments of the present invention, the total amount of the semiconducting light emitting nanoparticles is in the range from 0.1 wt. % to 90 wt. % based on the total amount of the composition, preferably from 10 wt. % to 70 wt. %, more preferably from 15 wt. % to 50 wt. %.

—Ligands

In some embodiments of the present invention, optionally, the light emitting moiety can be directly over coated by one or more ligands as described above already.

As the ligands, phosphines and phosphine oxides such as Trioctylphosphine oxide (TOPO), Trioctylphosphine (TOP), and Tributylphosphine (TBP); phosphonic acids such as Dodecylphosphonic acid (DDPA), Tridecylphosphonic acid (TDPA), Octadecylphosphonic acid (ODPA), and Hexylphosphonic acid (HPA); amines such as Oleylamine, Dedecyl amine (DDA), Tetradecyl amine (TDA), Hexadecyl amine (HDA), and Octadecyl amine (ODA), Oleylamine (OLA), 1-Octadecene (ODE), erucic acid, octadecanethiol, thiols such as hexadecane thiol and hexane thiol; mercapto carboxylic acids such as mercapto propionic acid and mercaptoundecanoicacid; carboxylic acids such as oleic acid, stearic acid, myristic acid; acetic acid, Polyethylenimine (PEI), monofunctional PEG thiol (mPEG-thiol) or a derivatives of mPEG thiol and a combination of any of these can be used.

Examples of such ligands have been described in, for example, the laid-open international patent application No. WO 2012/059931A.

—Use of the Composition

In another aspect, the present invention relates to use of the composition of the present invention, in an electronic device, optical device, sensing device or in a biomedical device or for fabricating an electronic device, sensing device, optical device or a biomedical device.

A layer containing the composition and a process of fabricating the layer In another aspect, the present invention relates to a layer containing the composition of the present invention.

In another aspect, the present invention relates to a layer containing at least, essentially consisting of or consisting of;

X) a light emitting moiety having at least one ligand, preferably said light emitting moiety has a plurality of ligands;

XI) a (meth)acrylate polymer; and

XII) a chemical compound of the present invention.

In a preferable embodiment, the layer thickness of the layer is in the range from 1 to 50 μm, preferably from 5 to 30, more preferably from 8 to 20, furthermore preferably from 10 to 15 μm.

In another aspect, the present invention relates to a method for forming a layer comprising, essentially consisting of or consisting of:

S1) providing the composition of the present invention onto a substrate, preferably by ink-jetting;

S2) curing the composition, preferably said curing is a photo curing performed by photo irradiation, thermal curing or a combination of a photo curing and a thermal curing.

In another aspect, the present invention relates to a layer obtained or obtainable by curing the composition or obtainable or obtained by the method of the present invention.

In another aspect, the present invention also relates to a layer containing at least, essentially consisting of or consisting of;

X) a light emitting moiety having at least one ligand, preferably said light emitting moiety has a plurality of ligands;

XI) a (meth)acrylate polymer; and

XII) a chemical compound of the present invention as already described above.

—Color Conversion Device (100)

A color conversion device (100) comprising at least, essentially consisting of or consisting of; a $1^{st}$ pixel (161) partly or fully filled with a layer comprising at least a matrix material (120) containing a light emitting moiety (110), and a bank (150) comprising at least a polymer material, preferably the color conversion device (100) further contains a supporting medium (170).

—$1^{st}$ Pixel (161)

According to the present invention, said $1^{st}$ pixel (161) comprises at least a matrix material (120) containing a light emitting moiety (110). In a preferable embodiment, the $1^{st}$ pixel (161) is a solid layer obtained or obtainable by curing the composition of the present invention containing at least one acrylate monomer together with at least one light emitting moiety (110), preferably said curing is a photo curing by photo irradiation, thermal curing or a combination of a photo curing and a thermal curing.

In some embodiments of the present invention, the layer thickness of the pixel (161) is in the range from 0.1 to 100 μm, preferably it is from 1 to 50 μm, more preferably from 5 to 25 μm.

In some embodiments of the present invention, the color conversion device (100) further contains a $2^{nd}$ pixel (162), preferably the device (100) contains at least said $1^{st}$ pixel (161), $2^{nd}$ pixel (162) and a $3^{rd}$ pixel (163), more preferably said $1^{st}$ pixel (161) is a red color pixel, the $2^{nd}$ pixel (162) is a green color pixel and the $3^{rd}$ pixel (163) is a blue color pixel, even more preferably the $1^{st}$ pixel (161) contains a red light emitting moiety (110R), the $2^{nd}$ color pixel (162) contains a green light emitting moiety (110G) and the $3^{rd}$ pixel (163) does not contain any light emitting moiety.

In some embodiments, at least one pixel (160) additionally comprises at least one light scattering particle (130) in the matrix material (120), preferably the pixel (160) contains a plurality of light scattering particles (130).

In some embodiments of the present invention, said $1^{st}$ pixel (161) consists of one pixel or two or more sub-pixels configured to emit red-color when irradiated by an excitation light, more preferably said sub-pixels contains the same light emitting moiety (110).

—Matrix Material (120)

In a preferable embodiment, the matrix material (120) contains a (meth)acrylate polymer, preferably it is a methacrylate polymer, an acrylate polymer or a combination of thereof, more preferably it is an acrylate polymer, even more preferably said matrix material (120) is obtained or obtainable from the composition of the present invention containing at least one acrylate monomer, further more preferably said matrix material (120) is obtained or obtainable from the composition of the present invention containing at least one di-acrylate monomer, particularly preferably said matrix material (120) is obtained or obtainable from the composition of the present invention containing at least one di-acrylate monomer and a mono-acrylate monomer, preferably said composition is a photosensitive composition.

—Bank (150)

In some embodiments of the present invention, the height of the bank (150) is in the range from 0.1 to 100 μm, preferably it is from 1 to 50 μm, more preferably from 1 to 25 μm, furthermore preferably from 5 to 20 μm.

In a preferred embodiment of the present invention, the bank (150) is configured to determine the area of said $1^{st}$ pixel (161) and at least a part of the bank (150) is directly contacting to at least a part of the $1^{st}$ pixel (161), preferably said $2^{nd}$ polymer of the bank (150) is directly contacting to at least a part of the $1^{st}$ polymer of the $1^{st}$ pixel (161).

More preferably, said bank (150) is photolithographically patterned and said $1^{st}$ pixel (161) is surrounded by the bank (150), preferably said $1^{st}$ pixel (161), the $2^{nd}$ pixel (162) and the $3^{rd}$ pixel (163) are all surrounded by the photolithographically patterned bank (150).

In another aspect, the present invention also relates to a method for fabricating a color conversion device (100) of the present invention, containing at least the following steps, preferably in this sequence;

Xi) Providing a bank composition onto a surface of a supporting medium

Xii) Curing the bank composition,

Xiii) Applying photo-patterning to the cured said composition to fabricate bank and a patterned pixel region, Xiv) Providing the composition of the present invention to at least one pixel region, preferably by ink-jetting, Xv) Curing the composition, preferably said color conversion device (100) further contains a supporting medium (170).

In another aspect, the present invention further relates to a color conversion device (100) obtainable or obtained from the method of the present invention.

In another aspect, the present invention further relates to use of the color conversion device (100) of the present invention in an optical device (300) containing at least one functional medium (320, 420, 520) configured to modulate a light or configured to emit light.

Further, in another aspect, the present invention further relates to an optical device (300) containing at least, essentially consisting of or consisting of; one functional medium (320, 420, 520) configured to modulate a light or configured to emit light, and the color conversion device (100) of the present invention.

PREFERRED EMBODIMENTS

1. A composition, preferably it is being of a photocurable composition, comprising at least, essentially consisting of or consisting of;

i) a light emitting moiety having at least one ligand, preferably said light emitting moiety has a plurality of ligands;

ii) at least one reactive monomer or a monomer mixture of two or more reactive monomers; and iii) a chemical compound, wherein said chemical compound comprises at least one group selected from the group consisting of unsaturated or saturated straight-chain alkyl group having carbon atoms 1 to 80 or unsaturated or saturated branched-chain alkyl group having carbon atoms 3 to 80, unsaturated or saturated straight-chain aryl-alkyl group having carbon atoms 5 to 45, unsaturated or saturated branched-chain aryl-alkyl group having carbon atoms 6 to 45, unsaturated or saturated straight-chain cyclo-alkyl group having carbon atoms 4 to 45; and unsaturated or saturated branched-chain cyclo-alkyl group having carbon atoms 6 to 45, where one or more non-adjacent $CH_2$ groups of the above mentioned groups is replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$;

or at least one group selected from the group consisting of unsaturated or saturated straight-chain alkyl group having carbon atoms 1 to 80 or unsaturated or saturated branched-chain alkyl group having carbon atoms 3 to 80, where one or more non-adjacent $CH_2$ groups is not replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$; unsaturated or saturated straight chain aryl-alkyl group having carbon atoms 4 to 45, unsaturated or saturated branched chain aryl-alkyl group having carbon atoms 6 to 45, unsaturated or saturated straight-chain cyclo-alkyl group having carbon atoms 4 to 45, unsaturated or saturated branched-chain cyclo-alkenyl group having carbon atoms 6 to 45; preferably one or more non-adjacent $CH_2$ groups of said groups is not replaced by oxygen atom, C═O, C═S, C═Se, C═NH, $SiH_2$, SO, $SO_2$, OS, or CONH;

wherein the molecular weight of said chemical compound is 2000 or less, preferably 1000 or less, even more preferably 500 or less and the molecular weight of said chemical compound is 100 or more, preferably 200 or more, even more preferably 300 or more. It means, the chemical compound of the present invention is not a polymer. It is a monomer or oligomer.

2. The composition of embodiment 1, wherein said chemical compound further comprises at least one group selected from one or more of members of the group consisting of phosphine group, phosphine oxide group, phosphate group, phosphonate group, thiol group, tertiary amine, carboxyl group, hetero cyclic group, silane group, sulfonic acid, hydroxyl group, phosphonic acid, preferably said group is a phosphate group, a phosphonate group, thiol group, a carboxyl group or a combination of any of these, more preferably it is a thiol group.

3. The composition of any one of the preceding embodiments, wherein said chemical compound is a polar ligand selected from one or more members of the group consisting of unsaturated or saturated straight-chain alkyl group having carbon atoms 1 to 80 or unsaturated or saturated branched-chain alkyl group having carbon atoms 3 to 80, unsaturated or saturated straight-chain aryl-alkyl group having carbon atoms 5 to 45, unsaturated or saturated branched-chain aryl-alkyl group having carbon atoms 6 to 45, unsaturated or saturated straight-chain cyclo-alkyl group having carbon atoms 4 to 45; and unsaturated or saturated branched-chain cyclo-alkyl group having carbon atoms 6 to 45, where one or more non-adjacent $CH_2$ groups of the above mentioned groups is replaced by oxygen atom, C=O, C=S, C=Se, C=NH, $SiH_2$, SO, $SO_2$, OS, or CONH and where one or more H atoms may be replaced by D, F, Cl, Br, I, CN or $NO_2$; and said ligand is a non-polar ligand selected from the group consisting of unsaturated or saturated straight-chain alkyl group having carbon atoms 1 to 80 or unsaturated or saturated branched-chain alkyl group having carbon atoms 3 to 80, unsaturated or saturated straight chain aryl-alkyl group having carbon atoms 4 to 45, unsaturated or saturated branched chain aryl-alkyl group having carbon atoms 6 to 45, unsaturated or saturated straight-chain cyclo-alkyl group having carbon atoms 4 to 45, unsaturated or saturated branched-chain cyclo-alkenyl group having carbon atoms 6 to 45, where one or more non-adjacent $CH_2$ groups of said groups of the non-polar ligand is not replaced by oxygen atom, C=O, C=S, C=Se, C=NH, $SiH_2$, SO, $SO_2$, OS, or CONH and where one or more H atoms may be replaced by D, F, Cl, Br, I, CN or $NO_2$; or said chemical compound is a non-polar ligand selected from one or more members of the group selected from ligand selected from the group consisting of unsaturated or saturated straight-chain alkyl group having carbon atoms 1 to 80 or unsaturated or saturated branched-chain alkyl group having carbon atoms 3 to 80, unsaturated or saturated straight chain aryl-alkyl group having carbon atoms 4 to 45, unsaturated or saturated branched chain aryl-alkyl group having carbon atoms 6 to 45, unsaturated or saturated straight-chain cyclo-alkyl group having carbon atoms 4 to 45, unsaturated or saturated branched-chain cyclo-alkenyl group having carbon atoms 6 to 45, where one or more non-adjacent $CH_2$ groups of said groups of the non-polar ligand is not replaced by oxygen atom, C=O, C=S, C=Se, C=NH, $SiH_2$, SO, $SO_2$, OS, or CONH and where one or more H atoms may be replaced by D, F, Cl, Br, I, CN or $NO_2$; and said ligand is a polar ligand selected from the group consisting of unsaturated or saturated straight-chain alkyl group having carbon atoms 1 to 80 or unsaturated or saturated branched-chain alkyl group having carbon atoms 3 to 80, unsaturated or saturated straight-chain aryl-alkyl group having carbon atoms 5 to 45, unsaturated or saturated branched-chain aryl-alkyl group having carbon atoms 6 to 45, unsaturated or saturated straight-chain cyclo-alkyl group having carbon atoms 4 to 45; and unsaturated or saturated branched-chain cyclo-alkyl group having carbon atoms 6 to 45, where one or more non-adjacent $CH_2$ groups of the above mentioned groups is replaced by oxygen atom, C=O, C=S, C=Se, C=NH, $SiH_2$, SO, $SO_2$, OS, or CONH and where one or more H atoms may be replaced by D, F, Cl, Br, I, CN or $NO_2$.

4. The composition of any one of the preceding embodiments, wherein the total amount of said chemical compound (T) added in the composition is determined based on the following formula ($I^a$) and ($II^a$).

$$Tch=(Pl-Pm)*Al/(Pm-P) \qquad (I^a)$$

Pl: polarity value of the ligand of the light emitting moiety

Pm: the polarity value of the monomer mixture where the monomer mixture of two or more reactive monomers are used in the composition Al: total amount of the ligand P: polarity value of the chemical compound Tch: predetermined total amount of the chemical compound $$T=Tch*Z \qquad (II^a)$$

$0.5 \le Z \le 1.5$, preferably $0.7 \le Z \le 1.3$, more preferably $0.8 \le Z \le 1.2$;

T: Total amount of the chemical compound

5. The composition of any one of the preceding embodiments, wherein the ratio of the total weight of the chemical compound to the total weight of the light emitting moiety is in the range 0.6:40 to 1:3; in case of said light emitting moiety is an inorganic light emitting material, the ratio of the weight of the chemical compound to the weight of the inorganic part of the inorganic light luminescent material is in the range from 0.003 to 3.2.

6. The composition of any one of the preceding embodiments, wherein said reactive monomer is a (meth) acrylate monomer selected from a mono-(meth)acrylate monomer, a di-(meth)acrylate monomer and/or a tri-(meth)acrylate monomer.

Preferably said reactive monomers of the monomer mixture is each independently selected from a mono-(meth) acrylate monomer, a di-(meth)acrylate monomer and/or a tri-(meth)acrylate monomer.

7. The composition of embodiment 6, said di-(meth) acrylate monomer is represented by following chemical formula ($I^b$), said mono-acrylate monomer is represented by following chemical formula ($II^b$) and/or said tri-(meth)acrylate monomer is represented by following chemical formula ($III^b$);

($I^b$)

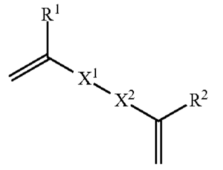

wherein $X^1$ is a non-substituted or substituted alkyl group or aryl group, where one or more non-adjacent $CH_2$ groups of alkyl or aryl group may be replaced by oxygen atom, C=O, C=S, C=Se, C=NH, $SiH_2$, SO, $SO_2$, OS, or CONH and where one or more H atoms may be replaced by D, F, Cl, Br, I, CN or $NO_2$; or $X^1$ is an ester group, preferably said alkyl group has carbon atoms 1 to 45, preferably said aryl group has carbon atoms 3 to 45;

$X^2$ is a non-substituted or substituted alkyl group, aryl group, where one or more non-adjacent $CH_2$ groups of alkyl or aryl group may be replaced by oxygen atom, C=O, C=S, C=Se, C=NH, $SiH_2$, SO, $SO_2$, OS, or CONH and where one or more H atoms may be replaced by D, F, Cl, Br, I, CN or $NO_2$; or $X^1$ is an ester group, preferably said alkyl group has carbon atoms 1 to 45, preferably said aryl group has carbon atoms 3 to 45;

$R^1$ is a hydrogen atom, halogen atom of Cl, Br, or F, methyl group, alkyl group, aryl group, where one or more non-adjacent $CH_2$ groups of alkyl or aryl group may be replaced by oxygen atom, C=O, C=S, C=Se, C=NH, $SiH_2$, SO, $SO_2$, OS, or CONH and where one or more H atoms may be replaced by D, F, Cl, Br, I, CN or $NO_2$; or $X^1$ is an ester group; preferably said ester group is a carboxylic acid group, preferably said alkyl group has carbon atoms 1 to 45, preferably said aryl group has carbon atoms 3 to 45;

$R^2$ is a hydrogen atom, halogen atom of Cl, Br, or F, methyl group, alkyl group, aryl group, where one or more non-adjacent $CH_2$ groups of alkyl or aryl group may be replaced by oxygen atom, C=O, C=S, C=Se, C=NH, $SiH_2$, SO, $SO_2$, OS, or CONH and where one or more H atoms may be replaced by D, F, Cl, Br, I, CN or $NO_2$; or $X^1$ is an ester group; preferably said ester group is a carboxylic acid group, preferably said alkyl group has carbon atoms 1 to 45, preferably said aryl group has carbon atoms 3 to 45;

preferably the symbol $X^1$ is,

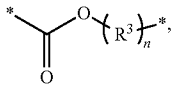

where "*" on the left side of the formula represents the connecting point to the carbon atom of the end group $C=CR^1$ of the formula (I) and "*" on the right side represents the connecting point to symbol $X^2$ of the formula (I); n is 0 or 1;

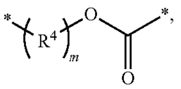

preferably the symbol $X^2$ is where"*" on the left side of the formula represents the connecting point to symbol X1 of the formula (I) and "*" on the right side represents the connecting point to the end group $C=CR^2$ of the formula (I);

m is 0 or 1;

preferably at least m or n is 1;

$R^3$ is a straight alkylene chain or alkoxylene chain having 1 to 25 carbon atoms, a cycloalkane having 3 to 25 carbon atoms or an aryl group having 3 to 25 carbon atoms, preferably $R^3$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC=CR^a$, C≡C, $Si(R^a)_2$, $Ge(R^a)_2$, $Sn(R^a)_2$, C=O, C=S, C=Se, $C=NR^a$, $P(=O)(R^a)$, SO, $SO_2$, $NR^a$, OS, or $CONR^a$ and where one or more H atoms may be replaced by D, F, Cl, Br, I, CN or $NO_2$;

$R^4$ is a straight alkylene chain or alkoxylene chain having 1 to 25 carbon atoms, a cycloalkane having 3 to 25 carbon atoms or an aryl group having 3 to 25 carbon atoms, preferably $R^4$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC=CR^a$, C≡C, $Si(R^a)_2$, $Ge(R^a)_2$, $Sn(R^a)_2$, C=O, C=S, C=Se, $C=NR^a$, $P(=O)(R^a)$, SO, $SO_2$, $NR^a$, OS, or $CONR^a$ and where one or more H atoms may be replaced by D, F, Cl, Br, I, CN or $NO_2$;

$R^a$ is at each occurrence, identically or differently, H, D or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another;

($II^b$)

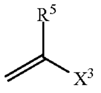

$X^3$ is a non-substituted or substituted alkyl group, aryl group or an alkoxy group;

preferably the symbol $X^3$ is

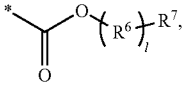

where "*" on the left side of the formula represents the connecting point to the end group $C=CR^5$ of the formula (I);

l is 0 or 1;

$R^5$ is a hydrogen atom, halogen atom of Cl, Br, or F, methyl group, alkyl group, aryl group, alkoxy group, ester group, or a carboxylic acid group;

$R^6$ is a straight alkylene chain or alkoxylene chain having 1 to 25 carbon atoms, where $R^6$ in the parenthesis is not a repeating unit of poly-alkoxylene, preferably $R^6$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC=CR^a$, C≡C, $Si(R^a)_2$, $Ge(R^a)_2$, $Sn(R^a)_2$, C=O, C=S, C=Se, $C=NR^a$, $P(=O)(R^a)$, SO, $SO_2$, $NR^a$, OS, or $CONR^a$ and where one or more H atoms may be replaced by D, F, Cl, Br, I, CN or $NO_2$;

$R^7$ is a straight alkylene chain or alkoxylene chain having 1 to 25 carbon atoms, preferably $R^7$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC=CR^a$, C≡C, $Si(R^a)_2$, $Ge(R^a)_2$, $Sn(R^a)_2$, C=O, C=S, C=Se, $C=NR^a$, $P(=O)(R^a)$, SO, $SO_2$, $NR^a$, OS, or $CONR^a$ and where one or more H atoms may be replaced by D, F, Cl, Br, I, CN or $NO_2$;

$R^a$ is at each occurrence, identically or differently, H, D or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another;

($III^b$)

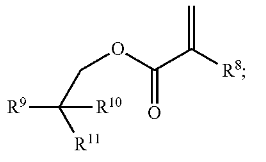

wherein $R^9$ is hydrogen atom, a straight alkyl group having 1 to 25 carbon atoms or a (meth)acryl group represented by chemical formula ($IV^b$)

($IV^b$)

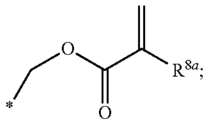

$R^{10}$ is hydrogen atom, a straight alkyl group having 1 to 25 carbon atoms or a meth)acryl group represented by chemical formula ($V^b$)

($V^b$)

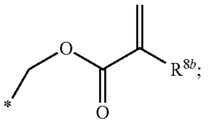

$R^{11}$ is hydrogen atom, a straight alkyl group having 1 to 25 carbon atoms or a (meth)acryl group represented by chemical formula ($VI^b$)

($VI^b$)

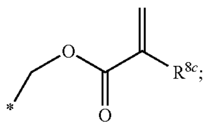

wherein $R^8$, $R^{8a}$, $R^{8b}$ and $R^{8c}$ are, each independently or dependently of each other at each occurrence, H or $CH_3$;

wherein at least one of $R^9$, $R^{10}$ and $R^{11}$ is a (meth)acryl group, preferably two of $R^9$, $R^{10}$ and $R^{11}$ are a (meth) acryl group and other one is a hydrogen atom or a straight alkyl group having 1 to 25 carbon atoms, preferably the electric conductivity (S/cm) of the (meth)acrylate monomer of formula (III) is $1.0*10^{-10}$ or less, preferably it is $5.0*10^{-11}$ or less, more preferably it is in the range from $5.0*10^{-11}$ to $1.0*10^{-15}$, even more preferably it is in the range from $5.0*10^{-12}$ to $1.0*10^{-15}$.

8. The composition of any one of the preceding embodiments, wherein the boiling point (B.P.) of said (meth) acrylate monomer of chemical formula (I) and/or chemical formula (II) is 250° C. or more, preferably the (meth)acrylate monomers of chemical formula (I) and chemical formula (II) are both 250° C. or more, more preferably it is in the range from 250° C. to 350° C., even more preferably from 280° C. to 350° C., furthermore preferably from 300° C. to 348° C.
9. The composition of any one of the preceding embodiments, wherein the viscosity of the composition is 35 (cP) or less at room temperature measured by a rheometer at 25° C., share rate at 1000[1/s], preferably in the range from 1 to 35 cP, more preferably from 2 to 30 cP, even more preferably from 2 to 25 cP.
10. The composition of any one of the preceding embodiments, comprises an another material selected from one or more members of the group consisting of;

iii) another light emitting moiety which is different from the light emitting moiety of embodiment 1;

iv) another (meth)acrylate monomer;

v) scattering particles, and vi) optically transparent polymers, antioxidants, radical quenchers, photo initiators and/or surfactants, preferably said another material is a scattering particle, preferably said another material is a scattering particle.

11. The composition of any one of the preceding embodiments, wherein the composition comprises a solvent 10 wt % or less based on the total amount of the composition, more preferably it is 5 wt % or less, more preferably it is a solvent free composition, preferably said composition does not comprise any one of the following solvent selected from one or more members of the group consisting of ethylene glycol monoalkyl ethers, such as, ethylene glycol monomethyl ether, ethylene glycol monoethyl ether, ethylene glycol monopropyl ether, and ethylene glycol monobutyl ether; diethylene glycol dialkyl ethers, such as, diethylene glycol dimethyl ether, diethylene glycol diethyl ether, diethylene glycol dipropyl ether, and diethylene glycol dibutyl ether; propylene glycol monoalkyl ethers, such as, propylene glycol monomethyl ether (PGME), propylene glycol monoethyl ether, and propylene glycol monopropyl ether; ethylene glycol alkyl ether acetates, such as, methyl cellosolve acetate and ethyl cellosolve acetate; propylene glycol alkyl ether acetates, such as, propylene glycol monomethyl ether acetate (PGMEA), propylene glycol monoethyl ether acetate, and propylene glycol monopropyl ether acetate; ketones, such as, methyl ethyl ketone, acetone, methyl amyl ketone, methyl isobutyl ketone, and cyclohexanone; alcohols, such as, ethanol, propanol, butanol, hexanol, cyclo hexanol, ethylene glycol, triethylene glycol and glycerin; esters, such as, ethyl 3-ethoxypropionate, methyl 3-methoxypropionate and ethyl lactate; and cyclic asters, such as, gamma-butyrolactone; chlorinated hydrocarbons, such as chloroform, dichloromethane, chlorobenzene, trimethyl benzenes such as 1,3,5-trimethylbenzene, 1,2,4-trimethyl benzene, 1,2,3-trmethyl benzene, docecylbenzene, cyclohexylbenzene, 1,2,3,4-tetramethylbenzene, 1,2,3,5-tetramethylbenzene, 3-isopropylbiphenyl, 3-methylbiphenyl, 4-methylbiphenyl and dichlorobenzene, preferably said solvent is propylene glycol alkyl ether acetates, alkyl acetates, ethylene glycol monoalkyl ethers, propylene glycol, and propylene glycol monoalkyl ethers.

12. Method for fabricating a composition comprising, essentially consisting of or consisting of:

I) identifying the polarity value of a ligand of a light emitting moiety and/or a chemical structure of a ligand of a light emitting moiety;

II) selecting a chemical compound based on the polarity value of the ligand and/or a chemical structure of the light emitting moiety to modify the sum of the polarity value of all the ligand and the polarity value of the chemical compound in the composition;

III) mixing at least the light emitting moiety of step (1) and a reactive monomer or a monomer mixture to obtain the composition;

IV) identifying the polarity value of the reactive monomer where one single reactive monomer is used in said composition or identifying the polarity value of the monomer mixture where the monomer mixture of two or more reactive monomers are used in the composition;

V) optionally, determining the amount of said chemical compound based on the polarity value of the ligand of the light emitting moiety; wherein said chemical compound is added before step III), in step III) or after step III), preferably in step III) or after step III).

Preferably said ligand is a plurality of ligands attached directly onto the light emitting moiety and said identification in step I) is applied to said plurality of ligands, preferably said chemical compound is a polar ligand selected from the group consisting of unsaturated or saturated straight-chain alkyl group having carbon atoms 1 to 80 or unsaturated or saturated branched-chain alkyl group having carbon atoms 3 to 80, unsaturated or saturated straight-chain aryl-alkyl group having carbon atoms 5 to 45, unsaturated or saturated branched-chain aryl-alkyl group having carbon atoms 6 to 45, unsaturated or saturated straight-chain cyclo-alkyl group having carbon atoms 4 to 45; and unsaturated or saturated branched-chain cyclo-alkyl group having carbon atoms 6 to 45, where one or more non-adjacent $CH_2$ groups of the above mentioned groups is replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$, when said ligand is a non-polar ligand selected from the group consisting of unsaturated or saturated straight-chain alkyl group having carbon atoms 1 to 80 or unsaturated or saturated branched-chain alkyl group having carbon atoms 3 to 80, unsaturated or saturated straight chain aryl-alkyl group having carbon atoms 4 to 45, unsaturated or saturated branched chain aryl-alkyl group having carbon atoms 6 to 45, unsaturated or saturated straight-chain cyclo-alkyl group having carbon atoms 4 to 45, unsaturated or saturated branched-chain cyclo-alkenyl group having carbon atoms 6 to 45, where one or more non-adjacent $CH_2$ groups of said groups of the non-polar ligand is not replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$; said chemical compound is a non-polar ligand selected from the group consisting of unsaturated or saturated straight-chain alkyl group having carbon atoms 1 to 80 or unsaturated or saturated branched-chain alkyl group having carbon atoms 3 to 80, unsaturated or saturated straight chain aryl-alkyl group having carbon atoms 4 to 45, unsaturated or saturated branched chain aryl-alkyl group having carbon atoms 6 to 45, unsaturated or saturated straight-chain cyclo-alkyl group having carbon atoms 4 to 45, unsaturated or saturated branched-chain cyclo-alkenyl group having carbon atoms 6 to 45, where one or more non-adjacent $CH_2$ groups of said groups of the non-polar ligand is not replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$ when said ligand is a polar ligand selected from the group consisting of unsaturated or saturated straight-chain alkyl group having carbon atoms 1 to 80 or unsaturated or saturated branched-chain alkyl group having carbon atoms 3 to 80, unsaturated or saturated straight-chain aryl-alkyl group having carbon atoms 5 to 45, unsaturated or saturated branched-chain aryl-alkyl group having carbon atoms 6 to 45, unsaturated or saturated straight-chain cyclo-alkyl group having carbon atoms 4 to 45; and unsaturated or saturated branched-chain cyclo-alkyl group having carbon atoms 6 to 45, where one or more non-adjacent $CH_2$ groups of the above mentioned groups is replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$.

13. A composition obtained or obtainable by the method of embodiment 12.

14. Method for forming a layer comprising, essentially consisting of or consisting of:

S1) providing the composition of any one of embodiments 1 to 10 onto a substrate, preferably by ink-jetting;

S2) curing the composition, preferably said curing is a photo curing performed by photo irradiation, thermal curing or a combination of a photo curing and a thermal curing.

15. A layer obtained or obtainable by curing the composition of any one of embodiments 1 to 10 or a layer obtained or obtainable by the method of embodiment 14.

16. A layer containing at least, essentially consisting of or consisting of;

X) a light emitting moiety having at least one ligand, preferably said light emitting moiety has a plurality of ligands;

XI) a (meth)acrylate polymer; and

XII) a chemical compound, wherein said chemical compound comprises at least one group selected from the group consisting of unsaturated or saturated straight-chain alkyl group having carbon atoms 1 to 80 or unsaturated or saturated branched-chain alkyl group having carbon atoms 3 to 80, where one or more non-adjacent $CH_2$ groups is replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$; unsaturated or saturated straight-chain alkoxyl group having carbon atoms 1 to 45 or unsaturated or saturated branched chain alkoxyl group having carbon atoms 3 to 45;

unsaturated or saturated straight-chain aryl-alkoxyl group having carbon atoms 5 to 45, unsaturated or saturated branched-chain aryl-alkoxyl group having carbon atoms 6 to 45; and unsaturated or saturated cyclo-alkoxyl group having carbon atoms 4 to 45;

or at least one group selected from the group consisting of unsaturated or saturated straight-chain alkyl group having carbon atoms 1 to 80 or unsaturated or saturated branched-chain alkyl group having carbon atoms 3 to 80, where one or more non-adjacent $CH_2$ groups is not replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$; straight-chain alkenyl group having carbon atoms 2 to 45; branched chain alkenyl group having carbon atoms 3 to 45; unsaturated or saturated straight chain aryl-alkyl group having carbon atoms 4 to 45; unsaturated or saturated branched chain aryl-alkyl group having carbon atoms 6 to 45, straight-chain aryl-alkenyl group having carbon atoms 5 to 45, branched chain aryl-alkenyl group having carbon atoms 6 to 45, unsaturated or saturated cyclo-alkyl group having carbon atoms 4 to 45, cyclo-alkenyl group having carbon atoms 4 to 45; preferably one or more non-adjacent $CH_2$ groups of said groups is not replaced by oxygen atom, C═O, C═S, C═Se, C═NH, $SiH_2$, SO, $SO_2$, OS, or CONH;

wherein the molecular weight of said chemical compound is 2000 or less, preferably 1000 or less, even more preferably 500 or less and the molecular weight of said chemical compound is 100 or more, preferably 200 or more, even more preferably 300 or more.

17. A color conversion device (100) comprising at least, essentially consisting of or consisting of; a 1st pixel (161) partly or fully filled with the layer of embodiment 15 or 16 comprising at least a matrix material (120) containing a light emitting moiety (110), and a bank (150) comprising at least a polymer material, preferably the color conversion device (100) further contains a supporting medium (170).

18. An optical device (300) containing at least, essentially consisting of or consisting of; one functional medium (320, 420, 520) configured to modulate a light or configured to emit light, and the color conversion device (100) of any one of embodiment 17.

Technical Effects of the Invention

Improved homogeneous dispersion of light emitting moieties in a composition containing a reactive monomer or a monomer mixture of two or more reactive monomers, improved homogeneous dispersion of scattering particles in the composition, preferably improved homogeneous dispersion of both light emitting particles and scattering particles, more preferably improved homogeneous dispersion of light emitting moieties and/or scattering particles without solvent; composition having lower viscosity suitable for inkjet printing, preferably a composition which can keep lower viscosity even if it is mixed with high loading of light emitting moieties and/or scattering particles, even more preferably without solvent; composition having lower vapor pressure for large area uniform printing; a new composition realizing no or reduced residue around ink jet printing nozzle during/after ink jet printing, improved QY and/or EQE of light emitting moieties in the composition, improved QY and/or EQE of light emitting moieties after printing; improved thermal stability; easy printing without clogging at a printing nozzle; easy handling of the composition, improved printing properties; simple fabrication process; improved absorbance of blue light; improved solidity of a layer made from the composition after inkjet printing.

The working examples 1-12 below provide descriptions of the present invention, as well as an in-detail description of their fabrication.

WORKING EXAMPLES mPEG350-SH: poly(ethylene glycol) methyl ether thiol, average Mn 350 mPEG800-SH: poly(ethylene glycol) methyl ether thiol, average Mn 800

LA: lauryl acrylate

HDDA: 1,6-hexanediol diacrylate

Working Example 1: Preparation of Matrix

To 0.04 g of Irganox™819 is added 2.368 g of LA and 0.592 g of HDDA. The mixture is shaken until complete dissolution of Irganox™ 819.

Comparative Example 1: Preparation of Red QD Ink 0.75 g of matrix obtained in example 1, 0.25 g of InP based red QD (core-double shells) having dodecyl group as a ligand dispersed in heptane are mixed in a glass flask and volatiles are evaporated on rotary evaporator under vacuum at 30 deg. C. Remaining volatiles are removed under vacuum of 60 mTorr on a Schlenk line.

Working Example 2: Preparation of Red QD Ink with mPEG350-SH 0.05 g of mPEG350-SH is dissolved in 1 mL of toluene, 0.25 g of InP based red QD having dodecyl group as a ligand dispersed in heptane is added and the mixture is stirred for 1.5 hrs. Then 0.7 g of matrix obtained in example 1 is added, volatiles are evaporated on rotary evaporator under vacuum at 30 deg. C. Remaining volatiles are removed under vacuum of 60 mTorr on a Schlenk line.

Working Example 3: Preparation of Red QD Ink with mPEG800-SH

Red QD ink with mPEG800-SH is prepared in the same manner as described in working example 2 above except for that mPEG800-SH is used instead of mPEG350-SH.

Working Example 4: Dispersibility Test

The red QD inks obtained in working example 2, 3 and the red QD ink obtained in comparative example 1 are stored in an atmospheric condition at room temperature.

The red QD inks of working example 2, 3 (especially red QD inks of working example 2, 3) shows excellent dispersibility compared to the comparative example 1 without any additive ligand.

Working Example 5: Nozzle Plate Wetting Test

Nozzle plate wetting test is performed as described below.

QD inks obtained in working examples 2, 3 and QD ink obtained in comparative example are each separately dropped onto an each nozzle plate of print head (Dimatix DMP-2831 material printer, Fuji film), then the dropped inks are removed by soaking up with the cleaning pad. Cleanness of the surface on the each nozzle plate is observed by eyes.

Results

The QD inks 2, 3 are well repelled on the nozzle plate. The surfaces of nozzle plates where QD inks 2, 3 are dropped are very clean after cleaning by the pad. It indicates that during ink jet printing, the ink composition especially QD inks 2, 3 of the present invention can be smoothly ink jetted onto a substrate without causing clogging, without remaining around nozzle of ink jet machine, without remaining on or around the surface of nozzle.

Working Example 6: Sample Preparation for DLS Evaluation of QD Having Non-Polar Ligand (Dodecane Thiol (DDT))

mPEG350SH and InP based core-double shell (ZnSe/ZnS) QD dispersed in Heptane are added in solvent. QD ratio in solvent is 0.5 w % and solvent ratio is 98.3 w %. mPEG350SH weighting ratio compared to DDT is 0 to 91%. Solvents are Heptane, LA, HDDA and LA+HDDA.

Working Example 7: Sample Preparation for DLS Evaluation of QD Having Non-Polar Ligand (Dodecanoic Acid)

mPEG350SH, (oleic acid) and QD (InP based ZnSe/ZnS double shell) dispersed in Heptane are added in solvent. QD ratio in solvent is 0.5 w % and solvent ratio is 97.8 w %. Weighting ratio of mPEG350SH compared to dodecanoic acid is 0-103%. (oleic acid is 41 w % compared to dodecanoic acid.) Solvents are Heptane, LA and LA+HDDA.

Working Example 8: Sample Preparation for DLS Evaluation of QD Having Polar Ligand (mPEG-SH)

DDT (or oleic acid) and QD dispersed in PGMEA are added in solvent. QD ratio in solvent is 0.5 w % and solvent ratio is 97.8 w %. Weighting ratio of DDT compared to mPEG-SH is 0 to 107%. (weighting ratio of oleic acid compared to mPEG-SH is 55%.) Solvents are PGMEA, LA, HDDA and LA+HDDA.

Working Example 9: Calculation of Hansen Solubility Parameter (HSP) of QD Having Non-Polar Ligand, QD Having Polar Ligand, Solvents

- HSP (δD, δP, δH) for Molecules are Calculated by HSPiP Software (pirica.com).
- HSP of Heptane is used for QD having non-polar ligand because —SH, —COOH part in non-polar ligand is sticked on the QD surface.
- HSP of poly(ethylene glycol) dimethyl ether is used for QD having polar ligand because —SH part in DDT is sticked on the QD surface.
- HSP of mixed solvents are determined by following additive rule.

Working Example 10: Preparation of Red QD Ink Containing QD Having DDT Ligand with mPEG 350SH Weighting ratio of mPEG350SH compared to DDT is 91%

| composition | |
|---|---|
| InP based core-ZnSe/ZnS double shell QD (ligand: C12SH) | 34.31% |
| mPEG-SH(MW350) | 5.12% |
| LA | 47.32% |
| HDDA | 11.83% |
| Omnirad819 | 0.93% |
| Irganox1010 | 0.48% |
| Total | 100.00% |

-continued

Comparative Example 2: Preparation of Red QD Ink Containing QD Having DDT Ligand

| composition | |
|---|---|
| InP based core-ZnSe/ZnS double shell QD (ligand: C12SH) | 35.00% |
| LA | 50.80% |
| HDDA | 12.70% |
| Omnirad819 | 1.00% |
| Irganox1010 | 0.50% |
| Total | 100.00% |

Working Example 11: Preparation of Red QD Ink Containing QD Having Dodecanoic Acid Ligand with mPEG350SH Weighting ratio of mPEG350SH compared to dodecanoic acid is 103%.

| composition | |
|---|---|
| InP based core-ZnSe/ZnS double shell QD (dodecanoic acid ligand) | 40.00% |
| mPEG-SH(MW350) | 4.80% |
| LA | 42.96% |
| HDDA | 10.74% |
| Omnirad819 | 1.00% |
| Irganox1010 | 0.50% |
| Total | 100.00% |

Comparative Example 3: Preparation of Red QD Ink Containing QD Having Dodecanoic Acid Ligand

| composition | |
|---|---|
| InP based core-ZnSe double shell QD (dodecanoic acid ligand) | 40.00% |
| LA | 46.80% |
| HDDA | 11.70% |
| Omnirad819 | 1.00% |
| Irganox1010 | 0.50% |
| Total | 100.00% |

Working Example 12: Preparation of Red QD Ink Containing QD Having mPEG-SH Ligand with Oleic Acid Weighting ratio of oleic acid (OA) compared to mPEG-SH ligand is 55%

| Composition | |
|---|---|
| InP based core-ZnSe double shell QD (mPEG-SH ligand) | 40.00% |
| OA | 4.80% |
| LA | 10.74% |
| HDDA | 42.96% |
| Omnirad819 | 1.00% |
| Irganox1010 | 0.50% |
| Total | 100.00% |

Results

Table 1 shows the result of DLS measurement of working example 6. Table 2 shows the result of DLS measurement of working example 7. Adding polar ligand to QD ink solution containing QDs having non-polar ligands & reactive monomers controls the cumulant size of QD that small cumulant size of QD shows no QD aggregation and well dispersed. Adding non-polar and polar ligands both into QD ink solution also control the size of QD in reactive monomers.

TABLE 1

| Weighting ratio of mPEG350SH comparing to DDT | Cumulant size of QD [nm] Heptane | LA | LA/HDDA 90/10 | LA/HDDA 80/20 | LA/HDDA 70/30 | LA/HDDA 60/40 | LA/HDDA 40/60 | HDDA |
|---|---|---|---|---|---|---|---|---|
| 0% | 14 | 690 | no disperse | no disperse | no disperse | no disperse | no disperse | no disperse |
| 16% | 16 | 15 | 95 | 961 | no disperse | no disperse | no disperse | no disperse |
| 33% | 34 | 15 | 14 | 192 | 836 | no disperse | no disperse | no disperse |
| 49% | 54 | 15 | — | 14 | 469 | no disperse | no disperse | no disperse |
| 66% | 892 | 15 | — | 14 | 15 | 518 | no disperse | no disperse |
| 82% | >1000 | 15 | — | 14 | 14 | 263 | no disperse | no disperse |
| 91% | >1000 | 17 | 16 | 16 | 15 | 254 | 820 | 462 |

TABLE 2

| Weighting ratio of mPEG350SH comparing to dodecanoic acid | Cumulant size of QD [nm] Heptane | LA | LA/HDDA 90/10 | LA/HDDA 80/20 |
|---|---|---|---|---|
| 0% | 38 | 83 | 53 | 268 |
| 62% | no disperse | 25 | 25 | 22 |
| 103% | no disperse | 23 | 25 | 20 |
| 62% + oleic acid (41%) | no disperse | 21 | 22 | 18 |

Table 3 shows the result of DLS measurement of working example 8. Adding non-polar ligand to QD ink solution containing QDs having polar ligands & reactive monomers controls the cumulant size of QD that small cumulant size of QD shows no QD aggregation and well dispersed in reactive monomers.

TABLE 3

| Weighting ratio DDT, oleic acid comparing to mPEGSH | Cumulant size of QD [nm] PGMEA | HDDA | LA/HDDA 20/80 | LA/HDDA 40/60 | LA/HDDA 60/40 | LA/HDDA 80/20 | LA |
|---|---|---|---|---|---|---|---|
| 0% | 12 | 19 | 951 | no disperse | no disperse | no disperse | no disperse |
| 17% (DDT) | 13 | 24 | 17 | 428 | no disperse | no disperse | no disperse |
| 32% (DDT) | 13 | 21 | 14 | 17 | 525 | no disperse | no disperse |
| 70% (DDT) | 11 | 108 | 13 | 13 | 15 | 28 | 229 |
| 107% (DDT) | 160 | 625 | 13 | — | — | 16 | 207 |
| 55% (oleic acid) | 12 | 15 | 18 | 459 | no disperse | no disperse | no disperse |

Table 4 shows the result of HSP calculation of working example 8. δD is dispersion forces. δP is polar forces. δH is hydrogen bond forces. Mixing polar ligand and non-polar ligand can control HSP to close to that of reactive monomers. Close HSP between QD and reactive monomer is needed for well dispersed sample.

TABLE 4

| | δD | δP | δH |
|---|---|---|---|
| Non-polar ligand (Heptane) | 15.3 | 0 | 0 |
| Polar ligand (Poly(ethylene glycol)dimethyl ether) | 16.0 | 5.6 | 7.1 |
| (non-polar ligand)/(polar ligand) 50/50 | 15.7 | 2.8 | 3.6 |
| LA | 16.0 | 2.4 | 3.2 |
| HDDA | 16.3 | 3.9 | 5.1 |
| PGMEA | 15.6 | 5.6 | 9.8 |
| LA/HDDA 80/20 | 16.1 | 2.7 | 3.5 |
| LA/HDDA 20/80 | 16.3 | 3.6 | 4.7 |

The red QD inks of working example 10, 11, 12 show excellent dispersibility compared to the comparative example 2, 3.

The invention claimed is:

1. A composition comprising at least:

i) a light emitting moiety having at least one ligand;

ii) at least one reactive monomer or a monomer mixture of two or more reactive monomers; and iii) a chemical compound, wherein, when the at least one ligand is non-polar ligand, the chemical compound comprises at least one group selected from the group consisting of unsaturated or saturated straight-chain alkyl group having carbon atoms 1 to 80, unsaturated or saturated branched-chain alkyl group having carbon atoms 3 to 80, unsaturated or saturated straight-chain aryl-alkyl group having carbon atoms 5 to 45, unsaturated or saturated branched-chain aryl-alkyl group having carbon atoms 6 to 45, unsaturated or saturated straight-chain cyclo-alkyl group having carbon atoms 4 to 45, and unsaturated or saturated branched-chain cyclo-alkyl group having carbon atoms 6 to 45, where one or more non-adjacent $CH_2$ groups of the above mentioned groups is replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$;

or wherein, when the at least one ligand is polar ligand, the chemical compound comprises at least one group selected from the group consisting of unsaturated or saturated straight-chain alkyl group having carbon atoms 1 to 80, unsaturated or saturated branched-chain alkyl group having carbon atoms 3 to 80, where one or more non-adjacent $CH_2$ groups is not replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$, unsaturated or saturated straight chain aryl-alkyl group having carbon atoms 4 to 45, unsaturated or saturated branched chain aryl-alkyl group having carbon atoms 6 to 45, unsaturated or saturated straight-chain cyclo-alkyl group having carbon atoms 4 to 45, and unsaturated or saturated branched-chain cyclo-alkenyl group having carbon atoms 6 to 45;

wherein total amount of the chemical compound added in the composition is determined based on the following formulas ($I^a$) and ($II^a$):

$$T_{ch}=(P_l-P_m)*A_l/(P_m-P) \qquad (I^a)$$

wherein $P_l$ is a polarity value of the at least one ligand of the light emitting moiety, wherein $P_m$ is a polarity value of the monomer mixture of two or more reactive monomers used in the composition, wherein $A_1$ is total amount of the at least one ligand, wherein P is a polarity value of the chemical compound, wherein $T_{ch}$ is predetermined total amount of the chemical compound, $$T=T_{ch}*Z \qquad (IIa)$$

wherein value of Z is greater than or equal to 0.5 and less than or equal to 1.5, and wherein T is the total amount of the chemical compound.

2. The composition of claim 1, wherein the chemical compound further comprises at least one group selected from one or more of members of the group consisting of phosphine group, phosphine oxide group, phosphate group, phosphonate group, thiol group, tertiary amine, carboxyl group, hetero cyclic group, silane group, sulfonic acid, hydroxyl group, and phosphonic acid.

3. The composition of claim 1, wherein the at least one group of the chemical compound where one or more non-adjacent $CH_2$ groups is replaced by oxygen atom, C═O, C═S, C═Se, C═NH, $SiH_2$, SO, $SO_2$, OS, or CONH, comprises a polar ligand; and wherein the at least one group of the chemical compound where one or more non-adjacent $CH_2$ groups is not replaced by oxygen atom, C═O, C═S, C═Se, C═NH, $SiH_2$, SO, $SO_2$, OS, or CONH, comprises a non-polar ligand.

4. The composition of claim 1, wherein the ratio of the total weight of the chemical compound to the total weight of the light emitting moiety is in the range 0.6:40 to 1:3; in case of the light emitting moiety is an inorganic light emitting material, the ratio of the weight of the chemical compound to the weight of the inorganic part of the inorganic light emitting material is in the range from 0.003 to 3.2.

5. The composition of claim 1, wherein the reactive monomer is at least one (meth) acrylate monomer selected from the group consisting of a mono-(meth) acrylate monomer, a di-(meth) acrylate monomer and a tri-(meth) acrylate monomer.

6. The composition of claim 1, wherein the reactive monomer of the monomer mixture is each independently selected from the group consisting of a mono-(meth) acrylate monomer, a di-(meth) acrylate monomer and a tri-(meth) acrylate monomer.

7. The composition of claim 6, wherein the di-(meth) acrylate monomer is represented by following chemical formula ($I^b$), the mono-acrylate monomer is represented by following chemical formula (IIb) and the tri-(meth) acrylate monomer is represented by following chemical formula ($III^b$);

($I^b$)

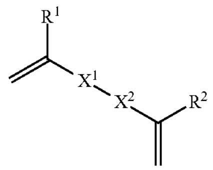

wherein $X^1$ is a non-substituted or substituted alkyl group or aryl group, where one or more non-adjacent $CH_2$ groups of alkyl or aryl group may be replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$; or $X^1$ is an ester group;

$X^2$ is a non-substituted or substituted alkyl group, aryl group, where one or more non-adjacent $CH_2$ groups of alkyl or aryl group may be replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$; or $X^1$ is an ester group;

$R^1$ is a hydrogen atom, Cl, Br, or F, alkyl group, aryl group, where one or more non-adjacent $CH_2$ groups of alkyl or aryl group may be replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$; or $X^1$ is an ester group;

$R^2$ is a hydrogen atom, Cl, Br, or F, alkyl group, aryl group, where one or more non-adjacent $CH_2$ groups of alkyl or aryl group may be replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$; or $X^1$ is an ester group;

(II$^b$)

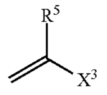

$X^3$ is a non-substituted or substituted alkyl group, aryl group or an alkoxy group;

$R^5$ is a hydrogen atom, Cl, Br, or F, alkyl group, aryl group, alkoxy group, ester group, or a carboxylic acid group;

(III$^b$)

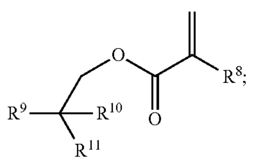

wherein $R^9$ is hydrogen atom, a straight alkyl group having 1 to 25 carbon atoms or a (meth) acryl group represented by chemical formula (IV$^b$)

(IV$^b$)

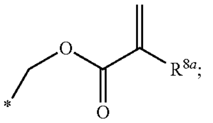

$R^{10}$ is hydrogen atom, a straight alkyl group having 1 to 25 carbon atoms or a (meth) acryl group represented by chemical formula (V$^b$)

(V$^b$)

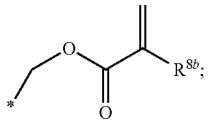

$R^{11}$ is hydrogen atom, a straight alkyl group having 1 to 25 carbon atoms or a (meth) acryl group represented by chemical formula (VI$^b$)

(VI$^b$)

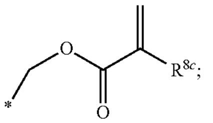

wherein $R^8$, $R^{8a}$, $R^{8b}$ and $R^{8c}$ are, each independently or dependently of each other at each occurrence, H or $CH_3$; wherein at least one of $R^9$, $R^{10}$ and $R^{11}$ is a (meth) acryl group.

8. The composition of claim 1, wherein the viscosity of the composition is 35 (cP) or less at room temperature measured by a rheometer at 25° C. shear rate at 1000 $s^{-1}$.

9. The composition of claim 1, further comprises another material selected from one or more members of the group consisting of;

iii) another light emitting moiety which is different from the light emitting moiety of claim 1;

iv) another (meth) acrylate monomer;

v) scattering particles, and vi) optically transparent polymers, antioxidants, radical quenchers, photo initiators and/or surfactants.

10. The composition of claim 1, wherein the composition comprises a solvent 10 wt % or less based on the total amount of the composition.

11. A method for fabricating a composition according to claim 1, comprising:

I) identifying the polarity value of a ligand of a light emitting moiety and/or a chemical structure of a ligand of a light emitting moiety;

II) selecting a chemical compound based on the polarity value of the ligand and/or a chemical structure of the light emitting moiety to modify the sum of the polarity value of all the ligand and the polarity value of the chemical compound in the composition;

III) mixing at least the light emitting moiety of step (I) and a reactive monomer or a monomer mixture to obtain the composition;

IV) identifying the polarity value of the reactive monomer where one single reactive monomer is used in the composition or identifying the polarity value of the monomer mixture where the monomer mixture of two or more reactive monomers are used in the composition;

V) optionally, determining the amount of the chemical compound based on the polarity value of the ligand of the light emitting moiety;

wherein the chemical compound is added before step III), in step III) or after step III).

12. A method for forming a layer comprising:

S1) providing the composition of claim 1 onto a substrate;

S2) curing the composition.

13. A method for forming a layer comprising:

S1) Providing by ink-jetting the composition of claim 1 onto a substrate;

S2) curing the composition, wherein the curing is a photo curing performed by photo irradiation, thermal curing or a combination of a photo curing and a thermal curing.

14. A layer comprising at least:

X) a light emitting moiety having at least one ligand;

XI) a (meth) acrylate polymer; and

XII) a chemical compound, wherein the chemical compound comprises at least one group selected from the group consisting of unsaturated or saturated straight-chain alkyl group having carbon atoms 1 to 80 or unsaturated or saturated branched-chain alkyl group having carbon atoms 3 to 80, where one or more non-adjacent $CH_2$ groups is replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$; unsaturated or saturated straight-chain alkoxyl group having carbon atoms 1 to 45 or unsaturated or saturated branched chain alkoxyl group having carbon atoms 3 to 45; unsaturated or saturated straight-chain aryl-alkoxyl group having carbon atoms 5 to 45, unsaturated or saturated branched-chain aryl-alkoxyl group having carbon atoms 6 to 45; and unsaturated or saturated cyclo-alkoxyl group having carbon atoms 4 to 45;

or at least one group selected from the group consisting of unsaturated or saturated straight-chain alkyl group having carbon atoms 1 to 80 or unsaturated or saturated branched-chain alkyl group having carbon atoms 3 to 80, where one or more non-adjacent $CH_2$ groups is not replaced by oxygen atom, C═O, C═S, C═Se, C═NH, $SiH_2$, SO, $SO_2$, OS, or CONH and where one or more H atoms may be replaced by D, F, Cl, Br, I, CN or $NO_2$; straight-chain alkenyl group having carbon atoms 2 to 45; branched chain alkenyl group having carbon atoms 3 to 45; unsaturated or saturated straight chain aryl-alkyl group having carbon atoms 4 to 45; unsaturated or saturated branched chain aryl-alkyl group having carbon atoms 6 to 45, straight-chain aryl-alkenyl group having carbon atoms 5 to 45, branched chain aryl-alkenyl group having carbon atoms 6 to 45, unsaturated or saturated cyclo-alkyl group having carbon atoms 4 to 45, cyclo-alkenyl group having carbon atoms 4 to 45, wherein the layer comprises a cured form of the composition according to claim 1.

15. A color conversion device comprising at least a first pixel partly or fully filled with the layer of claim 14 comprising at least a matrix material comprising a light emitting moiety, and a bank comprising at least a polymer material.

16. Optical device comprising at least one functional medium configured to modulate a light or configured to emit light, and the color conversion device of any one of claim 15.

17. A color conversion device comprising at least a first pixel partly or fully filled with the layer of claim 14 comprising at least a matrix material comprising a light emitting moiety, and a bank comprising at least a polymer material, wherein the color conversion device further comprises a supporting medium.

* * * * *